United States Patent
Abe et al.

(10) Patent No.: US 12,498,607 B2
(45) Date of Patent: Dec. 16, 2025

(54) DISPLAY DEVICE

(71) Applicant: Magnolia White Corporation, Tokyo (JP)

(72) Inventors: Hiroyuki Abe, Tokyo (JP); Akihiko Saitoh, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 0 days.

(21) Appl. No.: 18/813,118

(22) Filed: Aug. 23, 2024

(65) Prior Publication Data

US 2025/0076718 A1   Mar. 6, 2025

(30) Foreign Application Priority Data

Sep. 5, 2023   (JP) .................. 2023-143648

(51) Int. Cl.
| | | |
|---|---|---|
| *G02F 1/1362* | (2006.01) | |
| *G02F 1/1368* | (2006.01) | |
| *G09G 3/36* | (2006.01) | |
| *H10D 86/40* | (2025.01) | |
| *H10D 86/60* | (2025.01) | |

(52) U.S. Cl.
CPC ...... *G02F 1/136286* (2013.01); *G02F 1/1368* (2013.01); *G09G 3/3614* (2013.01); *G09G 3/3648* (2013.01); *G09G 2300/0426* (2013.01); *H10D 86/441* (2025.01); *H10D 86/60* (2025.01)

(58) Field of Classification Search
CPC ......... G09G 2300/0426; G09G 3/3648; H10D 86/60; G02F 1/1368
See application file for complete search history.

(56) References Cited

U.S. PATENT DOCUMENTS

| | | |
|---|---|---|
| 2011/0058116 A1 | 3/2011 | Yamazaki et al. |
| 2015/0123084 A1* | 5/2015 | Kim ............... H10D 86/60 257/43 |
| 2016/0300863 A1 | 10/2016 | Koide et al. |
| 2021/0096416 A1 | 4/2021 | Koide et al. |
| 2022/0189398 A1* | 6/2022 | Kimura ............... G09G 3/20 |
| 2022/0319462 A1* | 10/2022 | Kawashima ......... G06F 3/0443 |

FOREIGN PATENT DOCUMENTS

| | | |
|---|---|---|
| JP | 2014-146819 A | 8/2014 |
| JP | 2015-159315 A | 9/2015 |
| JP | 2016-200659 A | 12/2016 |
| WO | 2019/244603 A1 | 12/2019 |

* cited by examiner

*Primary Examiner* — Yuzhen Shen
(74) *Attorney, Agent, or Firm* — XSENSUS LLP

(57) ABSTRACT

A display device includes a first transistor including a first material as a semiconductor material and including a first gate electrode, a second transistor including a second material as a semiconductor material different from the first material and including a second gate electrode arranged in a different layer from the first gate electrode, a first wiring arranged in the same layer as the first gate electrode, a second wiring arranged in the same layer as the second gate electrode, and a third wiring formed in the same layer as a source electrode or a drain electrode of the second transistor and different from the first wiring and the second wiring. The first wiring, the second wiring and the third wiring overlap in a plan view.

8 Claims, 29 Drawing Sheets

DISPLAY DEVICE

CROSS-REFERENCE TO RELATED APPLICATION

This application claims the benefit of priority to Japanese Patent Application No. 2023-143648 filed on Sep. 5, 2023, the entire contents of which are incorporated herein by reference.

FIELD

An embodiment of the present invention relates to a display device.

BACKGROUND

In recent years, in order to display high-definition images, an increasing number of pixels is desired in a display device such as a head-mounted display. Increasing the number of pixels (higher definition) allows a user to view clearer images using a display device such as a head-mounted display. On the other hand, as the number of pixels increases, the number of signal lines for supplying image data corresponding to each pixel increases. As a result, the area of the signal line in the display device increases and the size of the display device increases. For example, International patent publication No. WO 2019/244603 and Japanese laid-open patent publication No. 2016-200659 disclose a display device in which the signal line is efficiently arranged.

Furthermore, in recent years, a transistor using an oxide semiconductor for a channel has been developed. The transistor using the oxide semiconductor for the channel has a simple structure and can be formed using a low-temperature process, similar to a transistor using amorphous silicon for the channel. The transistor using the oxide semiconductor for the channel has higher mobility and an extremely lower off-state current than the transistor using amorphous silicon for the channel. In the case where the transistor can be formed in a simple structure and in a low-temperature process, the manufacturing cost of the transistor can be suppressed. That is, the transistor using the oxide semiconductor for the channel is excellent in mobility and off-power of the transistor, and can suppress the manufacturing cost of the transistor. For example, Japanese laid-open patent publication No. 2014-146819 and Japanese laid-open patent publication No. 2015-159315 disclose transistors using an oxide semiconductor for a channel.

SUMMARY

A display device includes a first transistor including a first material as a semiconductor material and including a first gate electrode, a second transistor including a second material as a semiconductor material different from the first material and including a second gate electrode arranged in a different layer from the first gate electrode, a first wiring arranged in the same layer as the first gate electrode, a second wiring arranged in the same layer as the second gate electrode, and a third wiring formed in the same layer as a source electrode or a drain electrode of the second transistor and different from the first wiring and the second wiring. The first wiring, the second wiring and the third wiring overlap in a plan view.

A display device includes a first transistor including a first material as a semiconductor material and including a first gate electrode, a second transistor including a second material as a semiconductor material different from the first material and including a second gate electrode arranged in a layer different from the first gate electrode, a first wiring arranged in the same layer as the first gate electrode, a second wiring arranged in the same layer as the second gate electrode, and a third wiring formed in the same layer as a source electrode or drain electrode of the second transistor and different from the first wiring and the second wiring. The first wiring and the second wiring overlap in a plan view, and the first wiring and the second wiring are arranged at a distance from the third wiring in a plan view.

DESCRIPTION OF EMBODIMENTS

An object of an embodiment of the present invention is to provide a display device including a novel structure in which a signal line is efficiently arranged.

In the following description, a display device having a novel structure in which a signal line according to an embodiment of the present invention is efficiently arranged will be described with reference to the drawings and the like. However, the present invention can be implemented in many different aspects, and should not be construed as being limited to the description of the embodiments exemplified below. In order to make the description clearer, the drawings may be schematically represented with respect to the width, thickness, shape, and the like of each part compared with the actual embodiment, but the drawings are merely examples, and do not limit the interpretation of the present invention. In the present specification and the drawings, elements similar to those described above with respect to the above-described figures are denoted by the same reference signs (or reference signs added with a, b, and the like after numbers) and detailed description thereof may be omitted as appropriate. Furthermore, the terms "first" and "second" with respect to the respective elements are convenient signs used to distinguish the respective elements, and do not have any further meaning unless otherwise specified.

In the present specification, a member or region is "above (or below)" another member or region, includes, without limitation, the case where it is directly above (or below) the other member or region, but also the case where it is above (or below) the other member or region, that is, the case where another component is included between above (or below) the other member or region.

In the present specification, a first direction D1 intersects a second direction D2 and a third direction D3 intersects the first direction D1 and the second direction D2 (D1D2 plane). For example, the first direction D1, the second direction D2, and the third direction D3 correspond to a X direction (x direction), a Y direction (y direction), and a Z direction (z direction). The first direction D1 may be orthogonal to the second direction D2, the first direction D1 may be orthogonal to the third direction D3, and the second direction D2 may be orthogonal to the third direction D3.

In the present specification of the present application, in the case where the terms parallel, same, and match are used, errors within the scope of the design may be included in parallel, same, and match.

1. First Embodiment

A configuration of a display device 10 will be described with reference to FIG. 1 to FIG. 17.

1-1. Outline of Display Device 10

Figure 1:
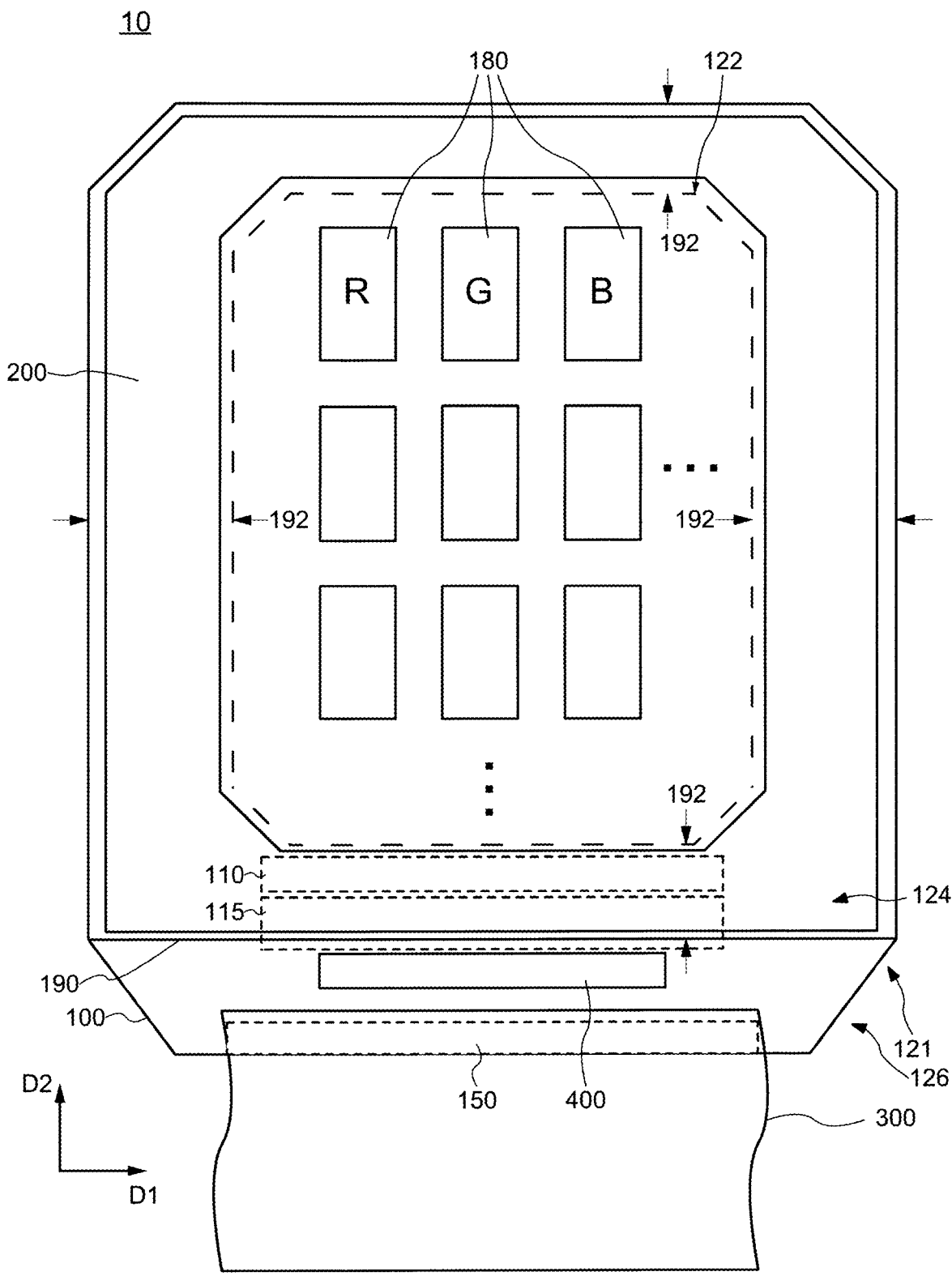
FIG. 1 is a plan view showing a configuration of a display device according to a first embodiment of the present invention.
Figure 2:
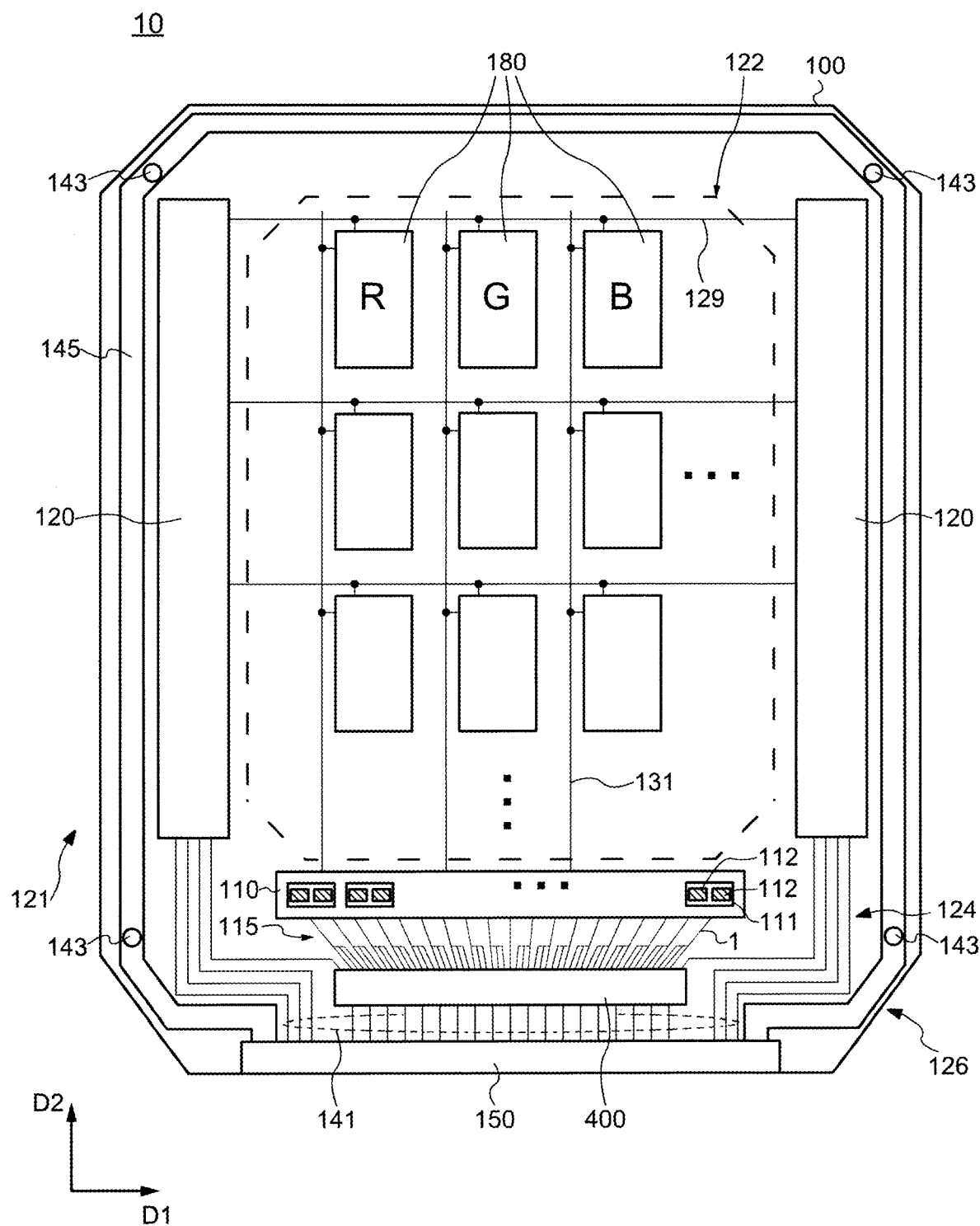
FIG. 2 is a plan view showing a circuit configuration of a display device according to the first embodiment of the present invention.

An outline of the display device 10 will be described with reference to FIG. 1 and FIG. 2. FIG. 1 is a schematic plan view showing a configuration of the display device 10. FIG. 2 is a schematic plan view showing a circuit configuration of the display device 10. For example, the display device 10 is a liquid crystal display device.

As shown in FIG. 1 or FIG. 2, the display device 10 includes an array substrate 100, a sealing part 200, a counter substrate 190, a flexible printed circuit board (FPC) 300, and an IC chip 400. The array substrate 100 and the counter substrate 190 are bonded together by the sealing part 200.

In addition, the display device 10 includes a display region 122 and a peripheral region 121 surrounding the display region 122. The peripheral region 121 includes a sealing region 124 and an exterior of the sealing region 124 surrounding the sealing region 124. The exterior of the sealing region 124 includes an exposed region 126.

A plurality of pixels 180 arranged in a matrix in the first direction D1 and the second direction D2 is arranged in the display region 122. The display region 122 is a region that overlaps a liquid crystal layer (not shown) containing liquid crystal molecules in a plan view.

A light-shielding part 192 overlapping the array substrate 100 and the counter substrate 190 is arranged in the peripheral region 121. The sealing part 200 is arranged in the sealing region 124. The sealing region 124 is a region that overlaps the sealing part 200 in a plan view.

A terminal part 150 is arranged in the exposed region 126. The exposed region 126 is a region where the array substrate 100 is exposed from the counter substrate 190. In addition, the exposed region 126 is a region that overlaps the FPC 300, the IC chip 400, part of a routing wiring part 115, and a plurality of terminals (see FIG. 5, for example, terminals 41 to 43) for connecting the IC chip 400 and the routing wiring part 115 in a plan view. In addition, the plurality of terminals is included in the array substrate 100 and overlaps the IC chip 400 in the third direction D3.

The sealing region 124, the exterior of the sealing region 124, and the exposed region 126 may be collectively referred to as a frame region in the display device 10.

The terminal part 150 includes a plurality of terminals (not shown). The routing wiring part 115 includes a plurality of data signal supply lines 1. The light-shielding part 192 overlaps the sealing part 200, a first driving circuit 110, a second driving circuit 120, part of the routing wiring part 115, and the common wiring 145, and has a function of hiding the sealing part 200, the first driving circuit 110, the second driving circuit 120, part of the routing wiring part 115, and the common wiring 145, and the like.

For example, the shape of the array substrate 100 of the display device 10 and the shape of the display region 122 are octagonal. In addition, the shape of the array substrate 100 of the display device 10 and the shape of the display region 122 are not limited to an octagon.

1-2. Circuit Configuration of Display Device 10

A circuit configuration of the display device 10 will be described with reference to FIG. 2. Configurations that are the same as or similar to those in FIG. 1 will be described as necessary.

As shown in FIG. 2, the terminal part 150 connected to the FPC 300 is connected to the IC chip 400 and the second driving circuit 120 by a connection wiring 141. The IC chip 400 is connected to the first driving circuit 110 using the plurality of data signal supply lines 1.

The first driving circuit 110 is arranged parallel to the direction D1 of the display region 122. The second driving circuit 120 is arranged parallel to the direction D2 of the display region 122. The first driving circuit 110 and the second driving circuit 120 overlap the sealing region 124 (FIG. 1) in a plan view. The region where the first driving circuit 110 and the second driving circuit 120 overlap is an example and is not limited to the sealing region 124 shown in FIG. 2. The region where the first driving circuit 110 and the second driving circuit 120 overlap may be a region outside the region where a pixel circuit 182 (see FIG. 3) of the plurality of pixels 180 is arranged.

For example, the first driving circuit 110 is a source driver and includes a plurality of multiplexer circuits 111 for selecting a data signal. The multiplexer circuit 111 includes a plurality of analog switches (ASW) 112. The plurality of ASWs 112 is electrically connected between a plurality of data signal lines 131 and the plurality of data signal supply lines 1, and has a function of electrically connecting the corresponding data signal line 131 and the data signal supply line 1, respectively. For the convenience of illustration, the multiplexor circuit 111 shown in FIG. 2 includes two ASWs 112. In practice, the multiplexer circuit 111 includes three or more ASWs 112.

For example, the second driving circuit 120 is a gate driver circuit. In addition, for example, the IC chip 400 supplies a control signal for driving the pixel circuit 182 to the first driving circuit 110 or the second driving circuit 120.

For example, each of the plurality of pixels 180 may correspond to a sub-pixel R, a sub-pixel G, and a sub-pixel B. The pixel 180 is the smallest unit constituting part of an image reproduced in the display region 122. One display element is arranged in each pixel 180. In the example shown in FIG. 1, the display element is a liquid crystal element 170 (see FIG. 3). The color corresponding to the sub-pixel is determined by the characteristics of the liquid crystal element 170 or a color filter (not shown) arranged in the sub-pixel. In addition, the color filters may be arranged in the counter substrate 190 and may be arranged in the array substrate 100.

For example, the sub-pixel R may include a red color filter that emits red, the sub-pixel G may include a green color filter that emits green, and the sub-pixel B may include a blue color filter that emits blue.

A plurality of data signal lines including the data signal line 131 extends in the direction D2 from the first driving circuit 110 and is connected to the plurality of pixels 180 arranged in the direction D2. A plurality of scanning signal lines including a scanning signal line 129 extends in the direction D1 from the second driving circuit 120 and is connected to the plurality of pixels 180 arranged in the direction D1.

For example, the common wiring 145 overlaps the peripheral region 121 and is arranged inside the outer periphery of the peripheral region 121. A common voltage is supplied to the common wiring 145 from an external device. For example, the common voltage may be a voltage between a voltage of a positive voltage amplitude of the data signal and a voltage of a negative voltage amplitude of the data signal, and may be a voltage that is a reference of the voltage amplitude, may be 0 V, and may be a ground voltage. The common wiring 145 may be electrically connected to a common electrode (not shown) formed in the counter substrate 190 via a plurality of connection parts 143, and may be electrically connected to a common electrode 146 using various wiring layers.

Since the FPC 300 is connected to the terminal part 150, the display device 10 is connected to an external device (not shown) connected to the FPC 300. For example, a signal from the external device is supplied to the IC chip 400, the first driving circuit 110, the second driving circuit 120, and each pixel 180. The display device 10 drives each pixel circuit 182 arranged in the display device 10 by using the signal from the external device and control signals generated by the IC chip 400, the first driving circuit 110, and the second driving circuit 120.

1-3. Configuration of Pixel Circuit 182 of Pixel 180

Figure 3:
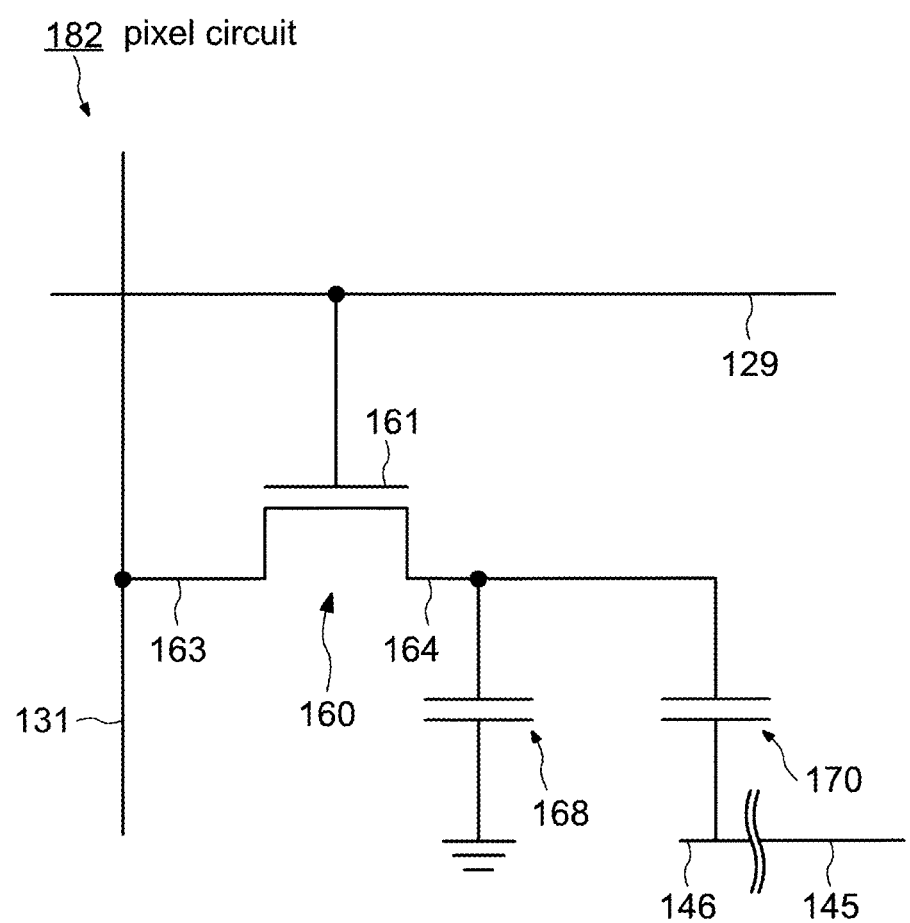
FIG. 3 is a schematic circuit diagram showing a configuration of a pixel circuit according to the first embodiment of the present invention.

A configuration of the pixel circuit 182 will be described with reference to FIG. 3. FIG. 3 is a schematic circuit diagram showing a configuration of the pixel circuit 182 of the pixel 180 of the display device 10. Configurations that are the same as or similar to those in FIG. 1 and FIG. 2 will be described as necessary.

For example, the pixel circuit 182 includes a transistor 160, the liquid crystal element 170, and a capacitance element 168. Although details will be described later, for example, a first electrode of the capacitance element 168 is a pixel electrode PTCO and a second electrode of the capacitance element 168 is grounded. Similar to the capacitance element 168, a first electrode of the liquid crystal element 170 is the pixel electrode PTCO and a second electrode of the liquid crystal element 170 is a common electrode CTCO. In addition, the first electrode and the second electrode of the capacitance element 168 are interchangeable, the first electrode and the second electrode of the liquid crystal element 170 are interchangeable, and the second electrode of the liquid crystal element 170 is the common electrode 146. In addition, the second electrode of the capacitance element 168 may be the common electrode CTCO and may be the common electrode 146. The transistor 160 includes a first gate electrode 161, a first source electrode 163, and a first drain electrode 164. The first gate electrode 161 is connected to the scanning signal line 129. The first source electrode 163 is connected to the data signal line 131. The first drain electrode 164 is connected to the first electrode of the capacitance element 168 and the first electrode of the liquid crystal element 170. Furthermore, in the present specification and the drawings, for convenience of explanation, the first source electrode 163 may be referred to as a source electrode and the first drain electrode 164 may be referred to as a drain electrode, and the function as a source and the function as a drain of each electrode may be replaced by a voltage supplied (applied) to the source electrode and the drain electrode of the transistor 160.

An arbitrary signal (voltage or current) is supplied to the pixel circuit 182 of each of the three sub-pixels of the display device 10, so that the display device 10 can display an image. For example, the IC chip 400, the first driving circuit 110, the second driving circuit 120, and the external device may change the orientation status of liquid crystal molecules contained in the liquid crystal element 170 by supplying a current or a voltage to each of the pixel electrode and the common electrode 146 included in the pixel circuit 182. As a result, the display device 10 can display an image.

1-4. Configuration of Display Device 10

Figure 4:
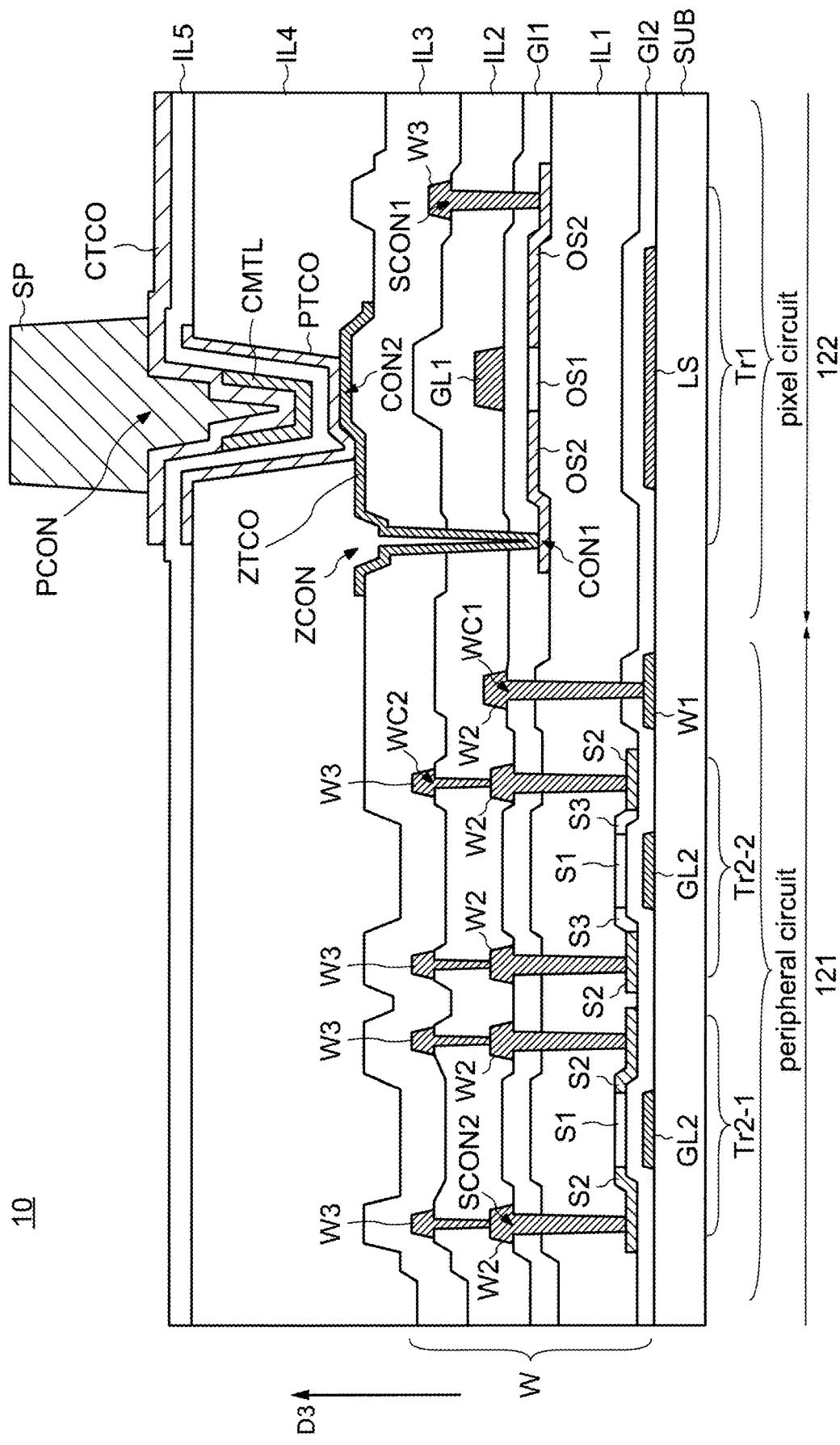
FIG. 4 is a cross-sectional view showing a cross-sectional structure of a display device according to the first embodiment of the present invention.

A configuration of the display device 10 will be described with reference to FIG. 4. FIG. 4 is a cross-sectional view showing a cross-sectional structure of the display device 10. The cross-sectional view shown in FIG. 4 is a cross-sectional view for explaining a layer structure in the cross-sectional structure of the display device 10. The cross-sectional view shown in FIG. 4 shows a transistor Tr2 in the peripheral region 121 and a transistor Tr1 in the pixel circuit (pixel circuit) 182 adjacent to each other. In practice, the pixel circuit 182 is included in the display region 122 and the transistor Tr2 is included in the peripheral region 121. Therefore, it is needless to say that these circuits shown adjacent to each other in FIG. 4 are arranged at a distance from the display device 10. In addition, the cross-sectional view shown in FIG. 4 shows the periphery of the contact hole of the pixel 180 and part of the transmission region (opening region) that contributes to the display of an image. For example, the transistor Tr2 and the transistor Tr1 are thin film transistors. Configurations that are the same as or similar to those in FIGS. 1 to 3 will be described as necessary.

As shown in FIG. 4, each layer included in the display device 10 is arranged above a substrate SUB (third direction D3). The display device 10 includes the transistor Tr1, the transistor Tr2, a wiring group W including a plurality of wirings, a connection electrode ZTCO, the pixel electrode PTCO, a common auxiliary electrode CMTL, and the common electrode CTCO. TCO is an abbreviation for Transparent Conductive Oxide. The transistor Tr1 is a transistor included in the pixel circuit 182 of the pixel 180 of the display device 10. The transistor Tr2 is a transistor included in a peripheral circuit such as the first driving circuit 110 or the second driving circuit 120. For example, the wiring group W includes a wiring W1, a wiring W2, and a wiring W3.

1-4-1. Configuration of Transistor Tr1

The transistor Tr1 includes an oxide semiconductor layer OS, a gate insulating layer Gl1, and a gate electrode GL1. The gate electrode GL1 faces the oxide semiconductor layer OS. The gate insulating layer Gl1 is arranged between the oxide semiconductor layer OS and the gate electrode GL1. For example, the transistor Tr1 of the display device 10 is a top-gate transistor in which the oxide semiconductor layer OS is arranged closer to the substrate SUB than the gate electrode GL1. The transistor Tr1 may be a bottom-gate transistor in which the positional relationship between the gate electrode GL1 and the oxide semiconductor layer OS is reversed.

The oxide semiconductor layer OS includes oxide semiconductor layers OS1 and OS2. The oxide semiconductor layer OS1 is an oxide semiconductor layer that overlaps the gate electrode GL1 in a plan view. The oxide semiconductor layer OS1 functions as a semiconductor layer and is switched between a conductive state and a non-conductive state depending on a voltage supplied to the gate electrode GL1. That is, the oxide semiconductor layer OS1 functions as a channel of the transistor Tr1. The oxide semiconductor layer OS2 functions as a conductive layer. The oxide semiconductor layers OS1 and OS2 are layers formed from the same oxide semiconductor layer. For example, the oxide semiconductor layer OS2 is an oxide semiconductor layer from which the resistance is reduced by doping an impurity into a layer having the same physical properties as the oxide semiconductor layer OS1.

An insulating layer IL2 is arranged on the gate electrode GL1. The wiring W3 is arranged on the insulating layer IL2. The wiring W3 is connected to the oxide semiconductor layer OS2 via an opening SCON1 arranged in the insulating layer IL2 and the gate insulating layer Gl1. A data signal related to a gradation of the pixel is supplied (transmitted) to the wiring W3. An insulating layer IL3 is arranged on the insulating layer IL2 and the wiring W3. The connection electrode ZTCO is provided on the insulating layer IL3. The connection electrode ZTCO is connected to the oxide semiconductor layer OS2 via an opening ZCON arranged in the insulating layers IL3 and IL2 and the gate insulating layer Gl1. The connection electrode ZTCO is in contact with the oxide semiconductor layer OS2 at the bottom of the opening ZCON. The connection electrode ZTCO is a transparent conductive layer.

A region where the connection electrode ZTCO and the oxide semiconductor layer OS2 are in contact is referred to as a first contact region CON1. The connection electrode ZTCO may be referred to as a "first transparent conductive layer". The first transparent conductive layer is in contact with the oxide semiconductor layer OS2 in the first contact region CON1 that does not overlap the gate electrode GL1 and the wiring W3 in a plan view. The first contact region CON1 is included in the display region 122 in a plan view.

For example, when a transparent conductive layer such as an ITO layer is formed so as to be in contact with a semiconductor layer such as a silicon layer, a surface of the semiconductor layer is oxidized by process gases and oxygen ions at the time of a deposition of an ITO film. Since the oxide layer formed on the surface of the semiconductor layer has a high resistance, the contact resistance between the semiconductor layer and the transparent conductive layer increases. As a result, poor electrical contact occurs between the semiconductor layer and a transparent electrode layer. On the other hand, even if the transparent conductive layer is formed to be in contact with the oxide semiconductor layer, the high resistance oxide layer as described above is not formed on a surface of the oxide semiconductor layer. Therefore, no failure occurs in the electrical contact between the oxide semiconductor layer and the transparent conductive layer.

An insulating layer IL4 is arranged on the connection electrode ZTCO. The insulating layer IL4 releases a step formed by a structure arranged below the insulating layer IL4. The insulating layer IL4 may be referred to as a planarization film. The pixel electrode PTCO is arranged on the insulating layer IL4. The pixel electrode PTCO is connected to the connection electrode ZTCO via an opening PCON arranged in the insulating layer IL4. A region where the connection electrode ZTCO and the pixel electrode PTCO are in contact is referred to as a second contact region CON2. The second contact region CON2 overlaps the gate electrode GL1 in a plan view. The pixel electrode PTCO is a transparent conductive layer.

An insulating layer IL5 is arranged on the pixel electrode PTCO. The common auxiliary electrode CMTL and the common electrode CTCO are arranged on the insulating layer IL5. Although details will be described later, the common auxiliary electrode CMTL and the common electrode CTCO have different planer patterns. The common auxiliary electrode CMTL is a metal layer. The common electrode CTCO is a transparent conductive layer. The electrical resistance of the common auxiliary electrode CMTL is lower than the electrical resistance of the common electrode CTCO. In addition, the common auxiliary electrode CMTL also functions as a light-shielding layer. For example, the common auxiliary electrode CMTL blocks light from adjacent pixels, thereby suppressing the occurrence of color mixing. A spacer SP is arranged on the common electrode CTCO.

The spacer SP is arranged for some pixels. For example, the spacer SP may be arranged for any one of the sub-pixel R, the sub-pixel G, and the sub-pixel B. However, the spacer SP may be arranged for all the pixels. A height of the spacer SP is half the height of a cell gap. A spacer is also arranged in the counter substrate 190 (see FIG. 1), and the spacer of the counter substrate 190 overlaps the spacer SP in a plan view. In addition, the height of the spacer SP may be a height corresponding to the cell gap. Furthermore, as shown in FIG. 4, although the spacer SP protrudes toward the counter substrate 190 while being filled in the opening PCON, it is also possible to use a configuration in which the contact hole is only filled with a filler.

A light-shielding layer LS is arranged between the transistor Tr1 and the substrate SUB. In a plan view, the light-shielding layer LS is arranged in a region where the gate electrode GL1 and the oxide semiconductor layer OS overlap. The light-shielding layer LS suppresses light incident from the substrate SUB side from reaching the oxide semiconductor layer OS1. In the case where a conductive layer is used as the light-shielding layer LS, the oxide semiconductor layer OS1 may be controlled by applying a voltage to the light-shielding layer LS. In the case where a voltage is applied to the light-shielding layer LS, the light-shielding layer LS and the gate electrode GL1 may be connected in the peripheral region 121 of the pixel circuit 182. In a plan view, the first contact region CON1 is arranged in a region not overlapping the light-shielding layer LS.

1-4-2. Configuration of Transistor Tr2

The transistor Tr2 includes a p-type transistor Tr2-1 and an n-type transistor Tr2-2. In the case where the transistor Tr2 is not distinguished, the transistor included in the peripheral region 121 is expressed as the transistor Tr2. In the case where the transistor Tr2 is distinguished, the transistor Tr2 is expressed as the p-type transistor Tr2-1, the n-type transistor Tr2-2, or the like.

Both the p-type transistor Tr2-1 and the n-type transistor Tr2-2 have a gate electrode GL2, a gate insulating layer GI2, and a semiconductor layer S. The gate electrode GL2 faces the semiconductor layer S. The gate insulating layer GI2 is arranged between the semiconductor layer S and the gate electrode GL2. For example, the transistor Tr2 of the display device 10 is a bottom-gate transistor in which the gate electrode GL2 is arranged closer to the substrate SUB side than the semiconductor layer S. The transistor Tr2 may be a top-gate transistor in which the positional relationship between the semiconductor layer S and the gate electrode GL2 is reversed.

The semiconductor layer S of the p-type transistor Tr2-1 includes semiconductor layers S1 and S2. The semiconductor layer S of the n-type transistor Tr2-2 includes the semiconductor layers S1, S2, and S3. The semiconductor layer S1 is a semiconductor layer in a region overlapping the gate electrode GL2 in a plan view. The semiconductor layer S1 functions as a channel of the transistor Tr2-1. The semiconductor layer S2 functions as a conductive layer. The semiconductor layer S3 functions as a conductive layer having a higher resistance than the semiconductor layer S2.

The semiconductor layer S3 suppresses hot carrier degradation by attenuating hot carriers that enter toward the semiconductor layer S1.

The insulating layer IL1 and the gate insulating layer GI1 are arranged on the semiconductor layer S. The gate insulating layer GI1 functions as an interlayer film in the transistor Tr2. The wiring W2 is arranged on these insulating layers. The wiring W2 is connected to the semiconductor layer S via an opening WC2 arranged in the insulating layer IL1 and the gate insulating layer GI1. In addition, the wiring W2 is connected to the wiring W1 via an opening WC1 arranged in the insulating layer IL1, the gate insulating layer GI1, and the gate insulating layer GI2. The insulating layer IL2 is arranged on the wiring W2. The wiring W3 is arranged on the insulating layer IL2. The wiring W3 is connected to the wiring W2 via the opening WC2 arranged in the insulating layer IL2.

The gate electrode GL2 is formed in the same layer as the wiring W1 and the light-shielding layer LS. The wiring W2 is formed in the same layer as the gate electrode GL1. The same layer means that a plurality of members is formed by patterning one layer.

1-4-3. Materials of Each Member of Display Device 10

A rigid substrate having light transmittance and having no flexibility, such as a glass substrate, a quartz substrate, or a sapphire substrate, can be used as the substrate SUB. On the other hand, in the case where the substrate SUB needs to have flexibility, a flexible substrate containing a resin and having flexibility, such as a polyimide substrate, an acrylic substrate, a siloxane substrate, or a fluororesin substrate, can be used as the substrate SUB. In order to improve the heat resistance of the substrate SUB, an impurity may be introduced into the resin.

A metal material can be used as the gate electrodes GL1 and GL2, the wirings W1, W2, and W3, the light-shielding layer LS, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), or silver (Ag), or an alloy or compound thereof is used as the metal material. The above-described metal material may be used in a single layer or in a stacked layer as the members of the electrode or the like.

For example, a stacked structure of Ti/Al/Ti is used as the gate electrode GL1. In the present embodiment, a cross-sectional shape of a pattern end of the gate electrode GL1 having the stacked structure is a forward tapered shape.

Common insulating materials can be used as the gate insulating layers GI1 and GI2 and the insulating layers IL1 to IL5. For example, an inorganic insulating layer such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), or aluminum nitride ($AlN_x$) can be used as the insulating layers IL1 to IL3, and IL5. An insulating layer with few defects can be used as these insulating layers. An organic insulating material such as a polyimide resin, an acryl resin, an epoxy resin, a silicone resin, a fluororesin, or a siloxane resin can be used as the insulating layer IL4. The above-described organic insulating material may be used as the gate insulating layers GI1 and GI2 and the insulating layers IL1 to IL3, and IL5. The above-described insulating material may be used in a single layer or in a stacked layer as the members of the insulating layer or the like.

$SiO_x$ having a thickness of 100 nm is used as the gate insulating layer GI1 as an example of the insulating layer described above. SiO$_x$/SiN$_x$/SiO$_x$ having a total thickness of 600 nm to 700 nm is used as the insulating layer IL1. SiO$_x$/SiN$_x$ having a total thickness of 60 nm to 100 nm is used as the gate insulating layer GI2. SiO$_x$/SiN$_x$/SiO$_x$ having a total thickness of 300 nm to 500 nm is used as the insulating layer IL2. SiO$_x$ (single layer), SiN$_x$ (single layer), or a stack thereof having a total thickness of 200 nm to 500 nm is used as the insulating layer IL3. An organic layer having a thickness of 2 μm to 4 μm is used as the insulating layer IL4. SiN$_x$ (single layer) having a thickness of 50 nm to 150 nm is used as the insulating layer IL5.

SiO$_x$N$_y$ and AlO$_x$N$_y$ are a silicon compound and an aluminum compound containing a smaller proportion (x>y) of nitrogen (N) than oxygen (O). SiN$_x$O$_y$ and AlN$_x$O$_y$ are a silicon compound and an aluminum compound containing a smaller proportion (x>y) of oxygen than nitrogen.

An oxide semiconductor having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used. In particular, an oxide semiconductor having a composition ratio of In:Ga:Zn:O=1:1:1:4 can be used. However, the oxide semiconductor containing In, Ga, Zn, and O used in the present embodiment is not limited to the above-described composition, and an oxide semiconductor having a composition other than the above can also be used. The material forming the oxide semiconductor layer OS may be referred to as a second material.

A material having semiconductor characteristics can be used as the semiconductor layer S. For example, a material forming the semiconductor layer S is polysilicon. The material forming the semiconductor layer S may be referred to as a first material.

A transparent conductive layer is used as the connection electrode ZTCO, the pixel electrode PTCO, and the common electrode CTCO. A mixture of indium oxide and tin oxide (ITO) or a mixture of indium oxide and zinc oxide (IZO) can be used as the transparent conductive layer. A material other than the above may be used as the transparent conductive layer.

For example, a material forming the sealing part 200 may be a thermosetting resin or a UV (UltraViolet) curable resin.

In addition, the gate electrode GL2 may be referred to as a first gate electrode, the gate electrode GL1 may be referred to as a second gate electrode, the wiring W1 may be referred to as a first wiring, the wiring W2 may be referred to as a second wiring, the source electrodes or drain electrodes of the transistor Tr2 and the transistor Tr1, and the wiring W3 may be referred to as a third wiring.

1-5. Configuration of Routing Wiring Part 115

Figure 5:
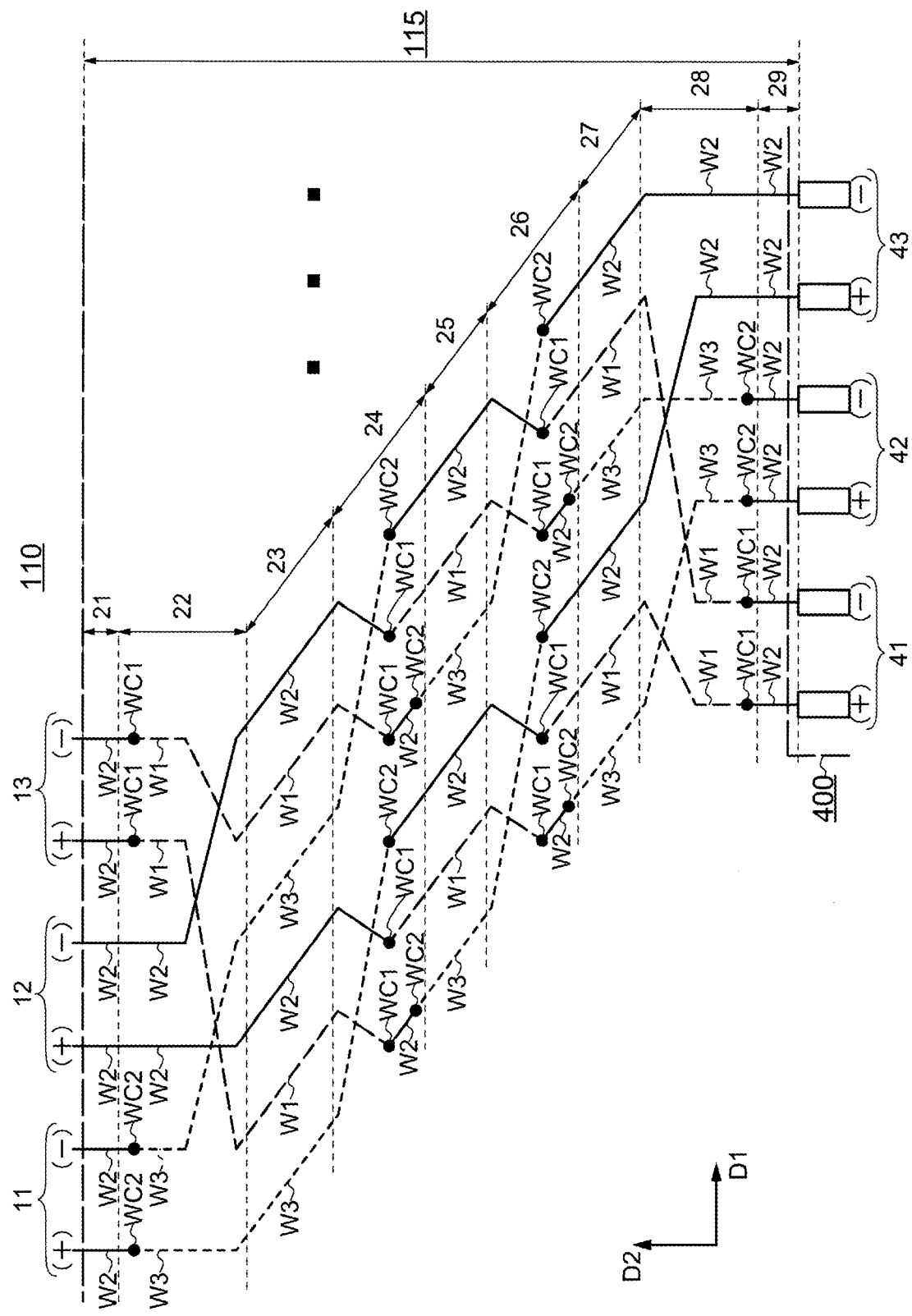
FIG. 5 is a schematic diagram showing a configuration of a routing wiring part according to the first embodiment of the present invention.
Figure 6:
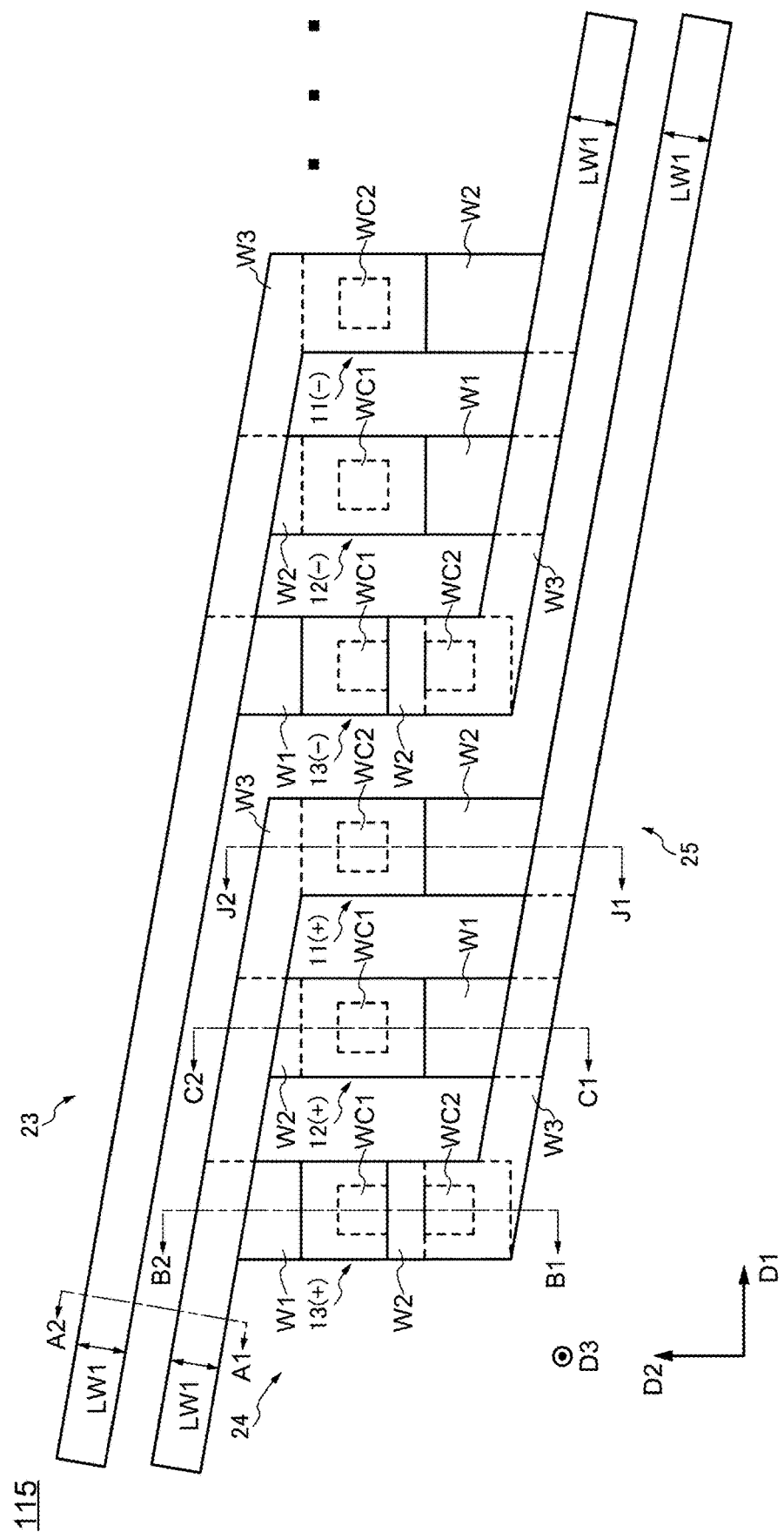
FIG. 6 is a diagram showing an example of a layout of a routing wiring part according to the first embodiment of the present invention.
Figure 7:
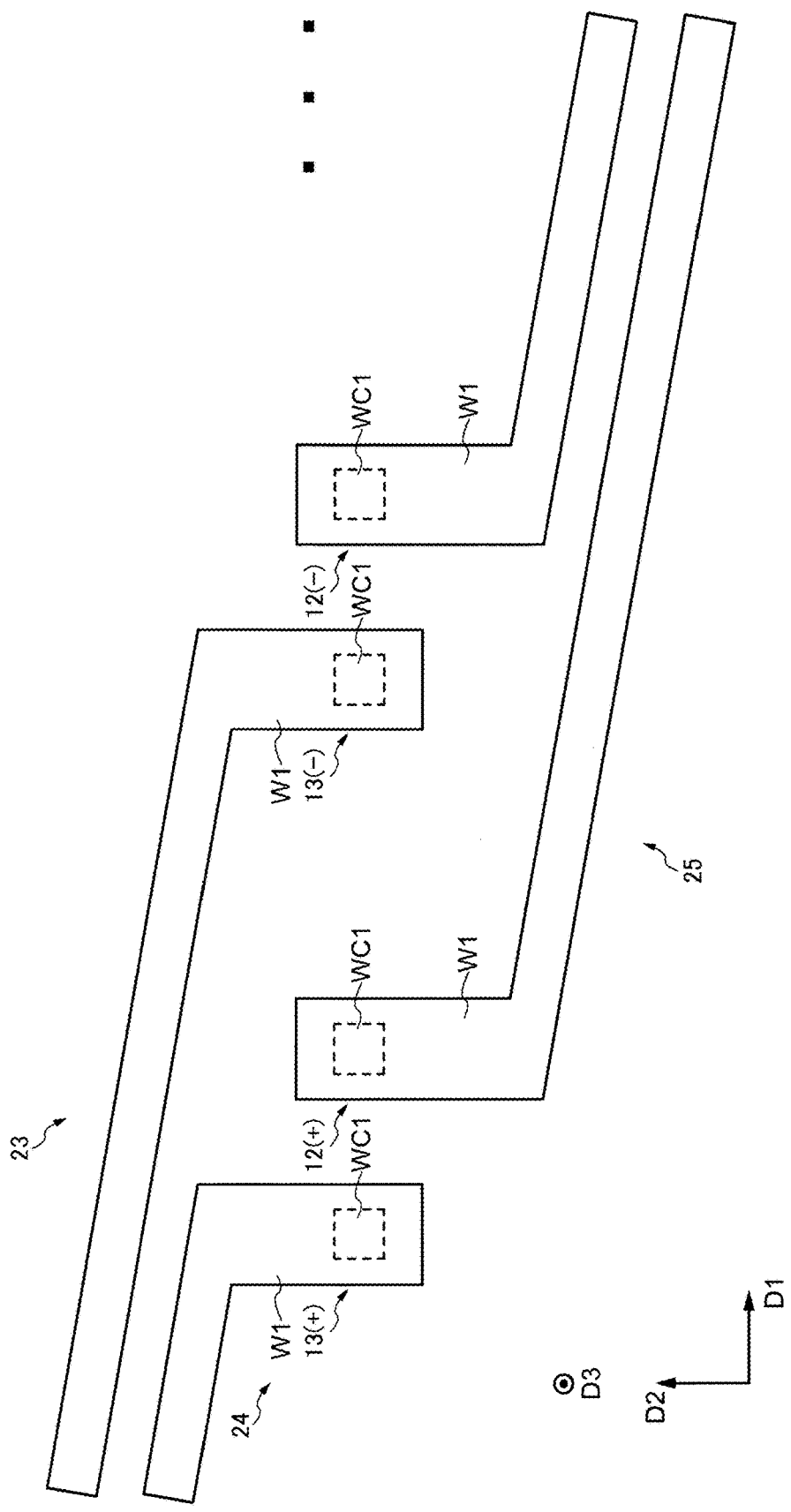
FIG. 7 is a diagram showing an example of a layout of a routing wiring part according to the first embodiment of the present invention.
Figure 8:
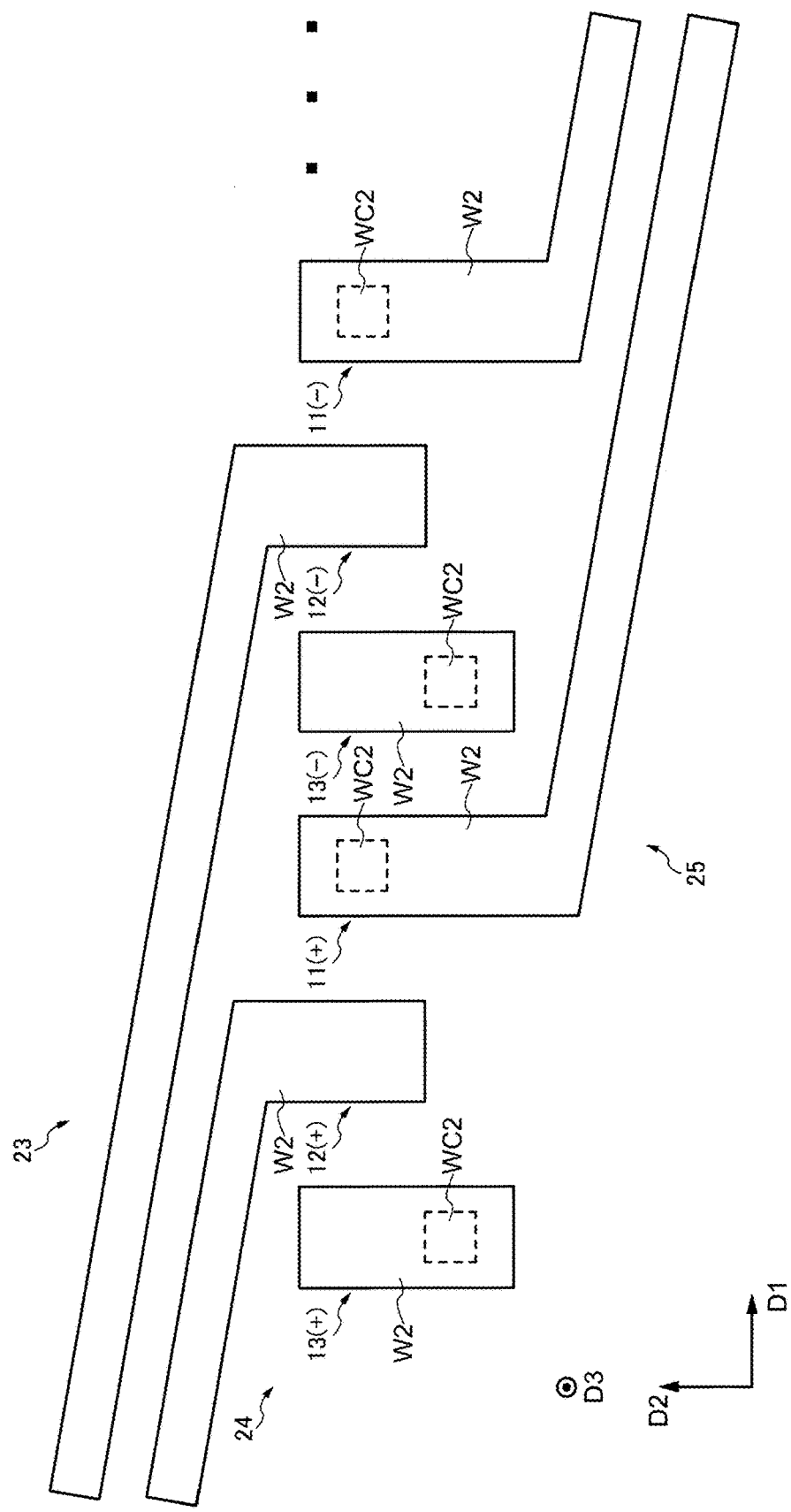
FIG. 8 is a diagram showing an example of a layout of a routing wiring part according to the first embodiment of the present invention.
Figure 9:
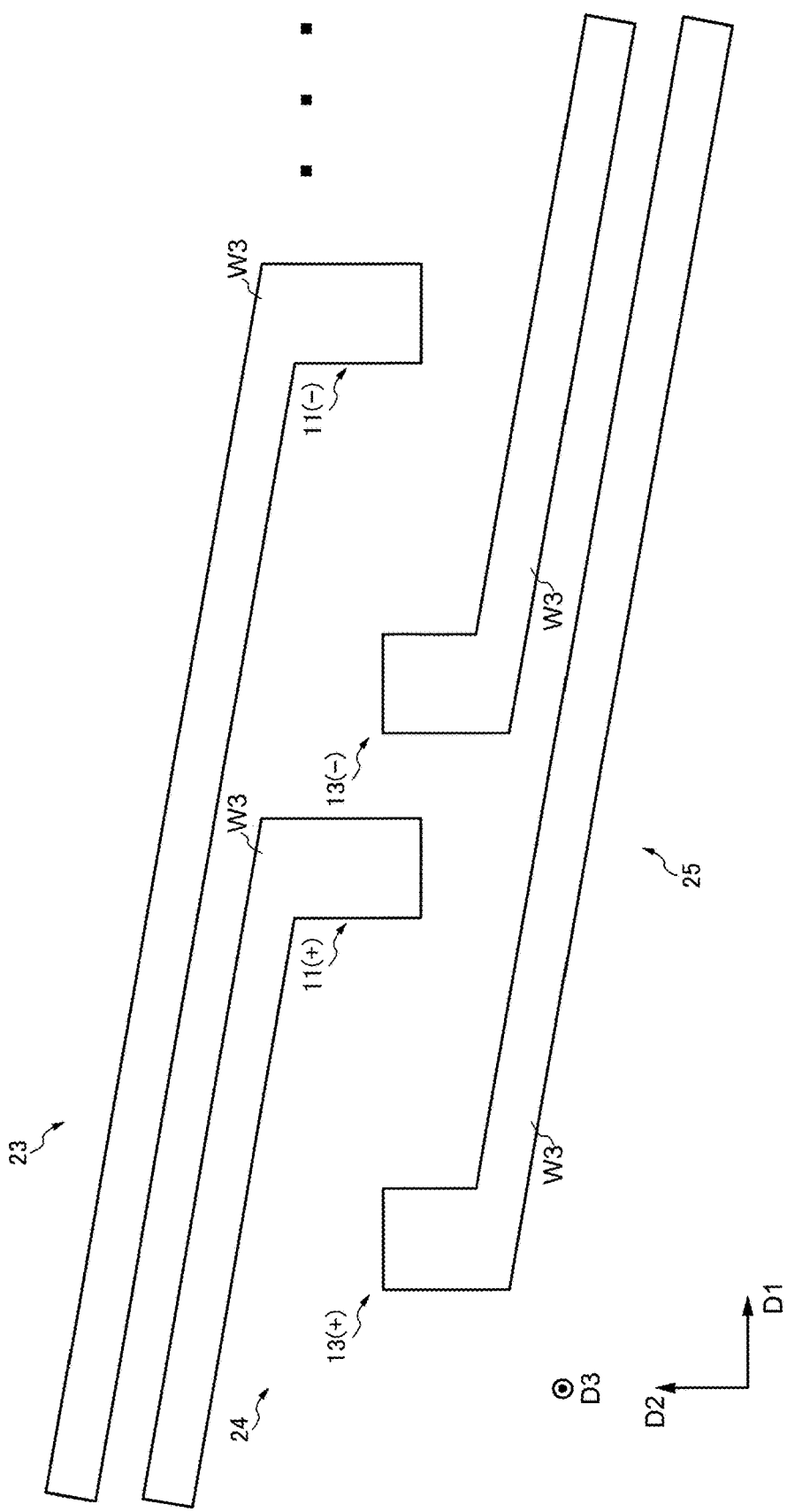
FIG. 9 is a diagram showing an example of a layout of a routing wiring part according to the first embodiment of the present invention.
Figure 10:
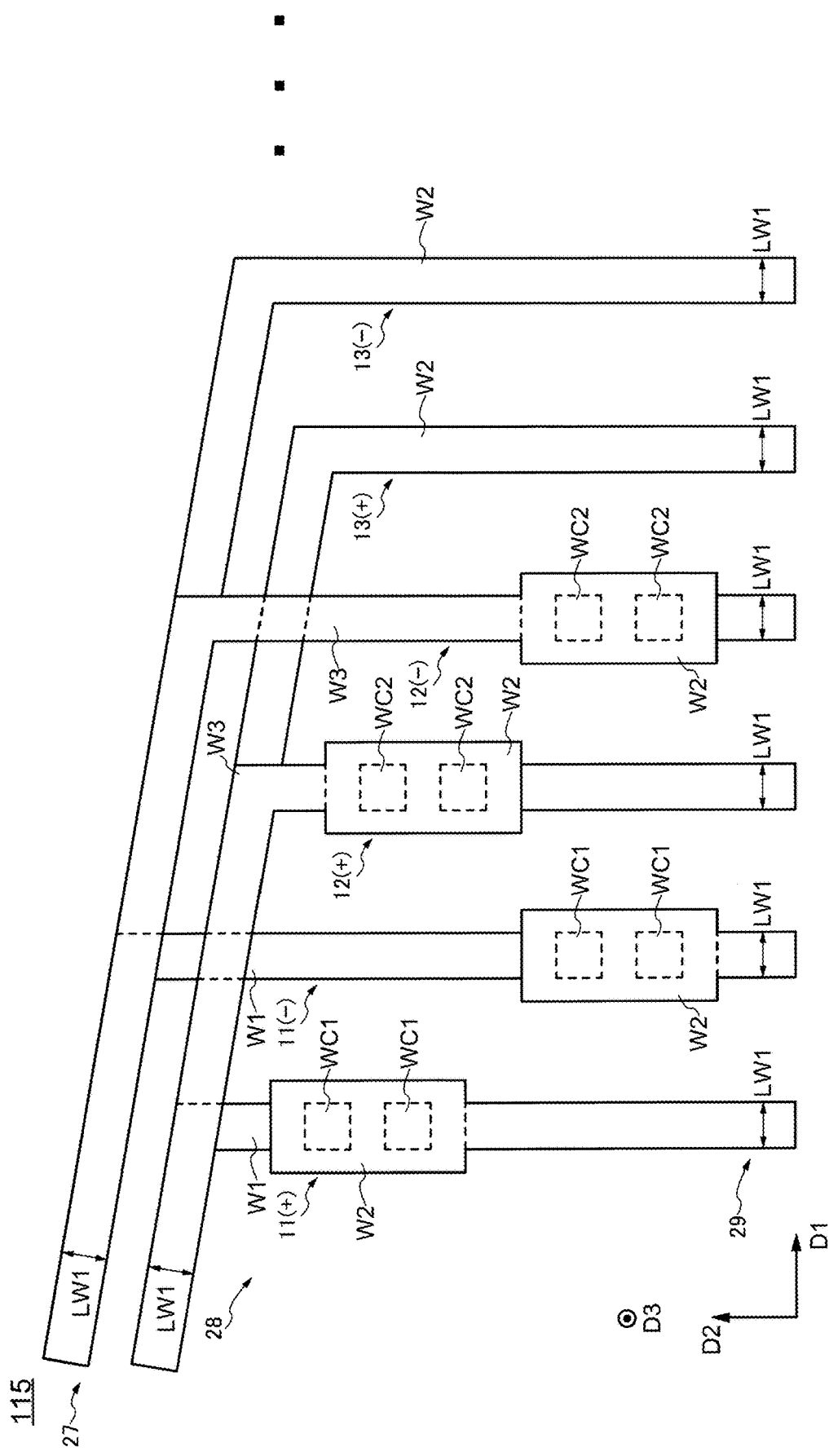
FIG. 10 is a diagram showing an example of a layout of a routing wiring part according to the first embodiment of the present invention.
Figure 11:
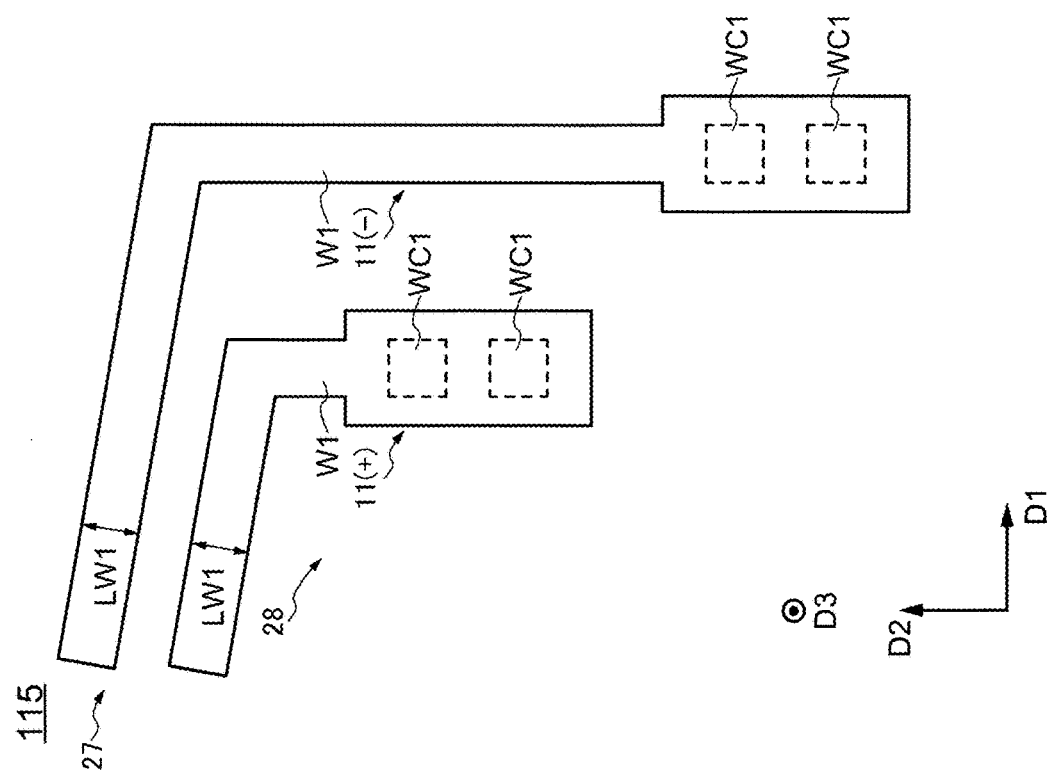
FIG. 11 is a diagram showing an example of a layout of a routing wiring part according to the first embodiment of the present invention.
Figure 12:
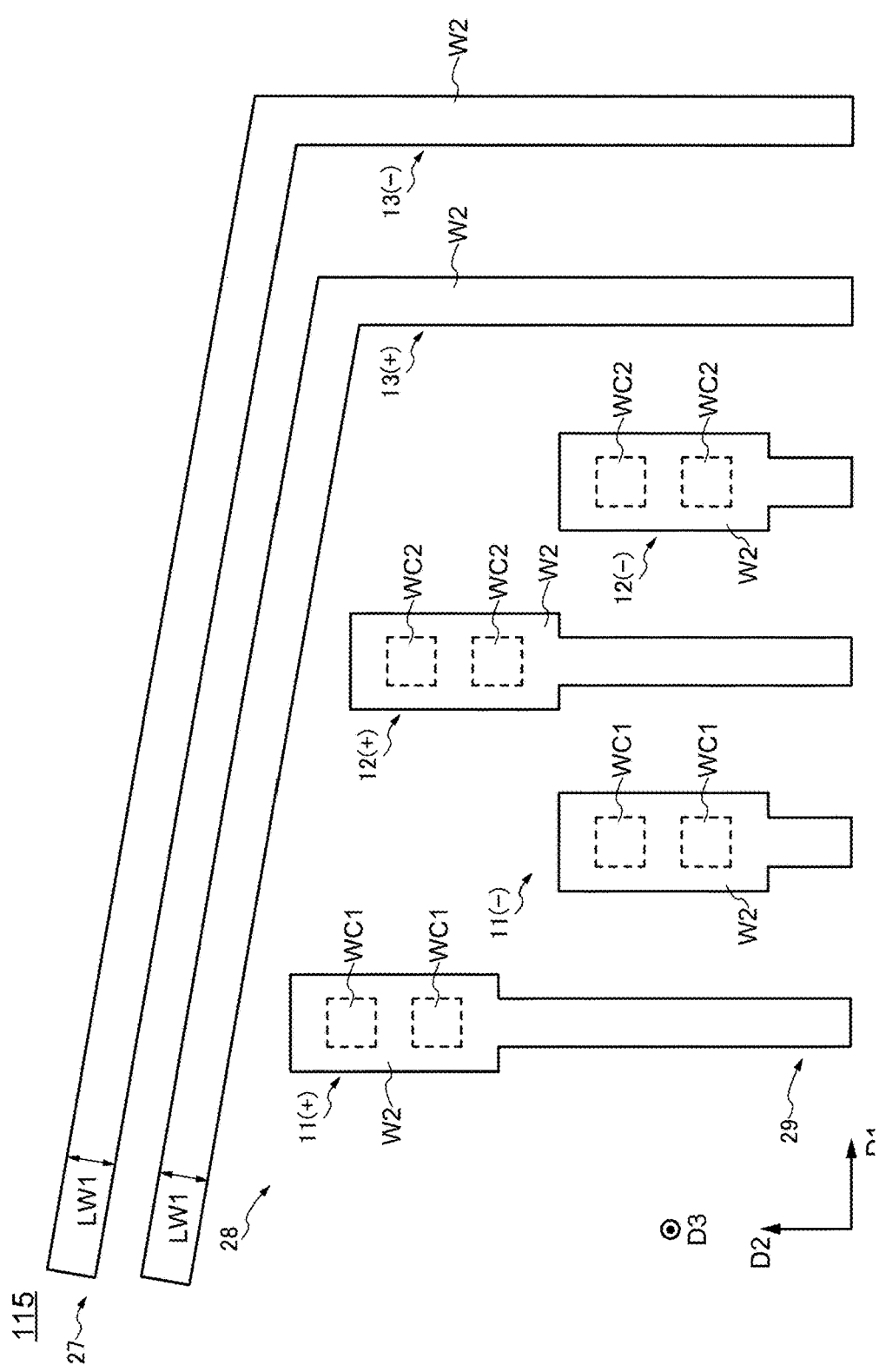
FIG. 12 is a diagram showing an example of a layout of a routing wiring part according to the first embodiment of the present invention.
Figure 13:
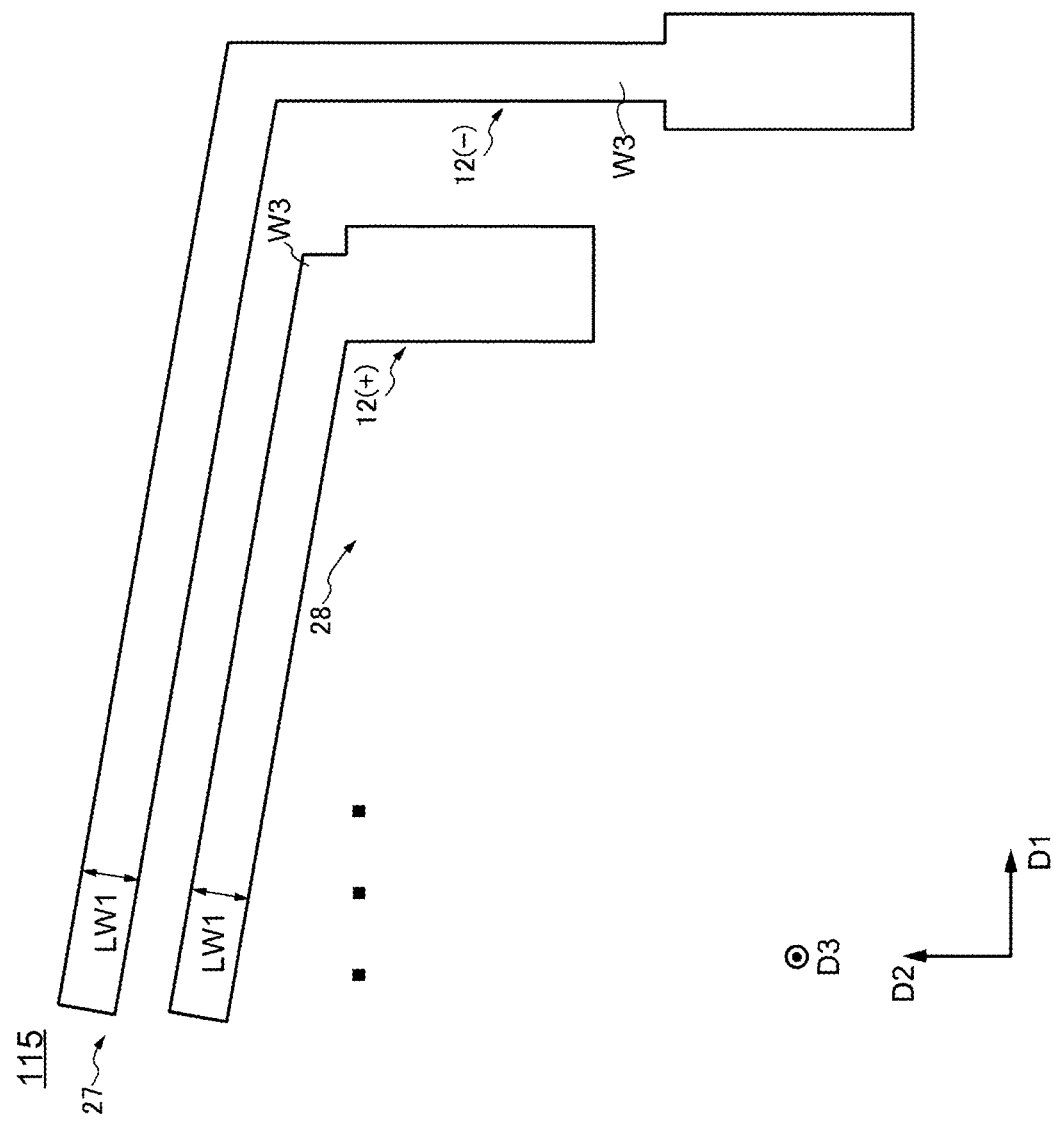
FIG. 13 is a diagram showing an example of a layout of a routing wiring part according to the first embodiment of the present invention.
Figure 14:
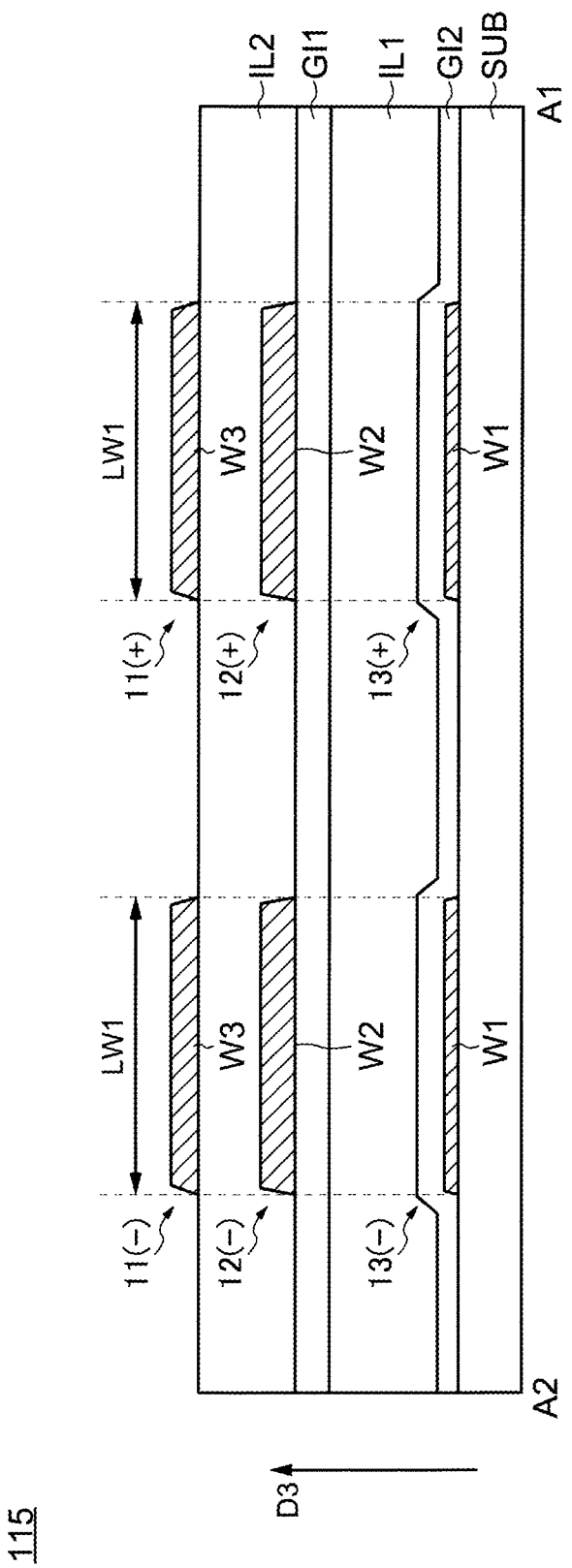
FIG. 14 is a cross-sectional view showing a cross-sectional structure along A1-A2 shown in FIG. 6.
Figure 15:
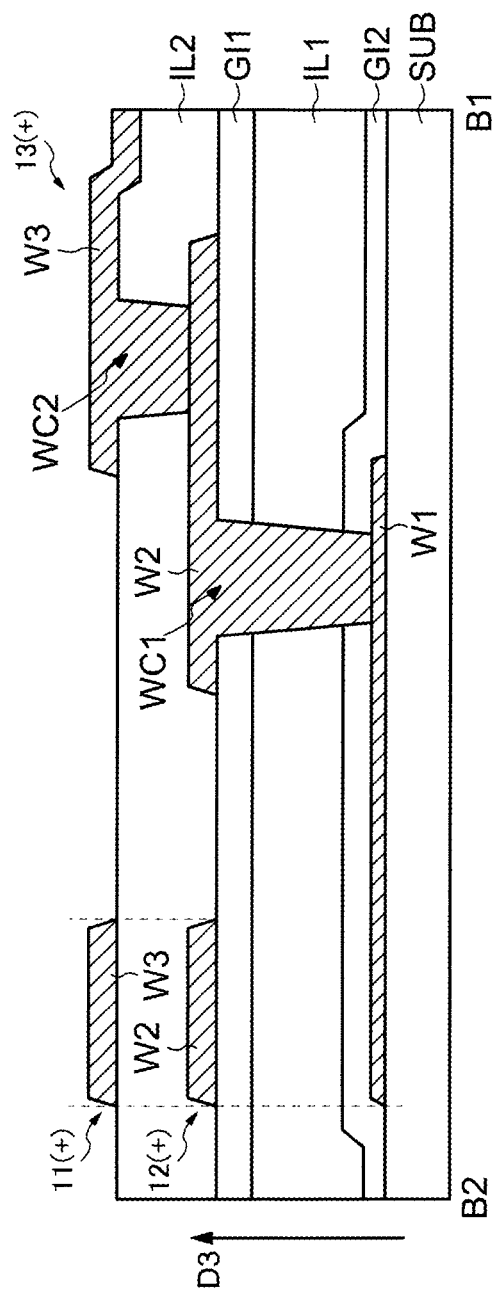
FIG. 15 is a cross-sectional view showing a cross-sectional structure along B1-B2 shown in FIG. 6.
Figure 16:
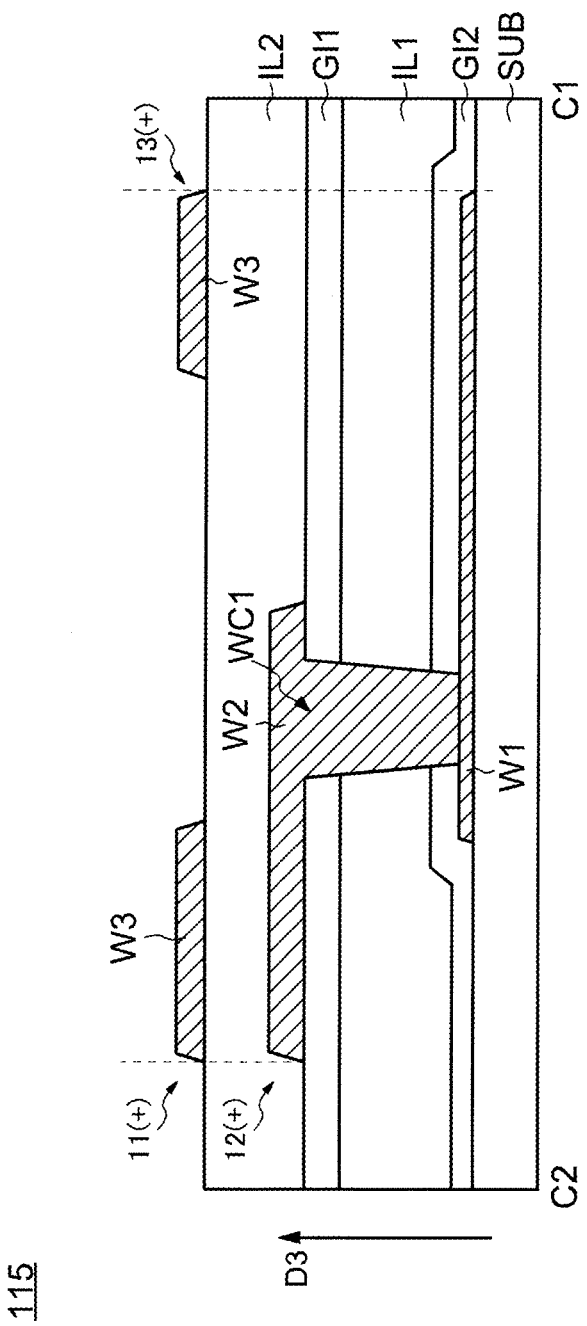
FIG. 16 is a cross-sectional view showing a cross-sectional structure along C1-C2 shown in FIG. 6.
Figure 17:
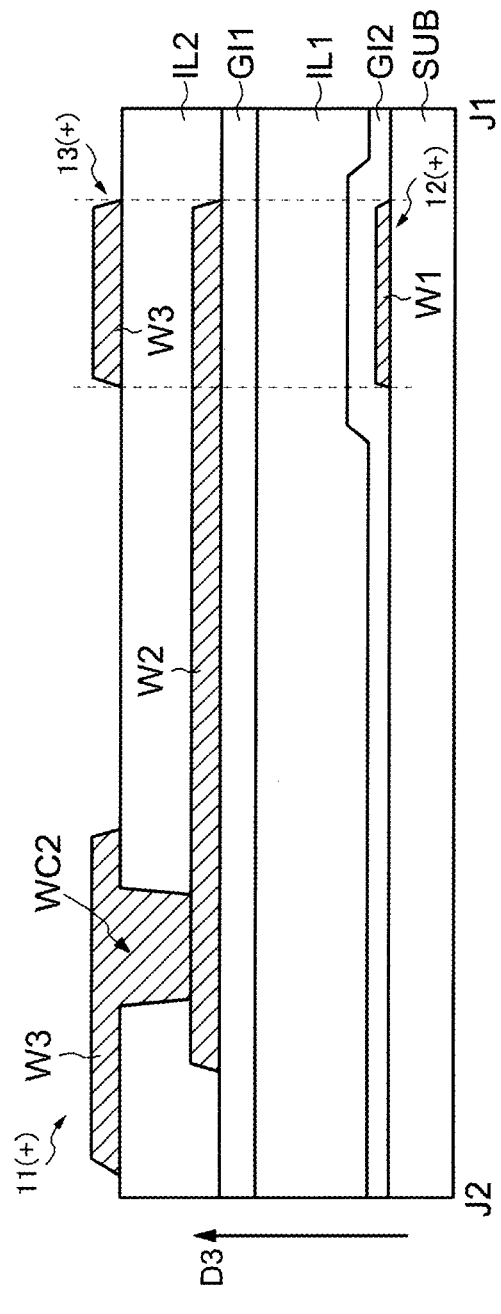
FIG. 17 is a cross-sectional view showing a cross-sectional structure along J1-J2 shown in FIG. 6.

A configuration of the routing wiring part 115 will be described with reference to FIG. 5 to FIG. 17. FIG. 5 is a schematic diagram showing a configuration of the routing wiring part 115. FIG. 6 is a diagram showing an example of a layout of the routing wiring part 115 overlapping wiring regions 23 to 25. FIG. 7 is a diagram in which the layout of the wiring W1 and the opening WC1 is extracted from the layout shown in FIG. 6. FIG. 8 is a diagram in which the layout of the wiring W2 and the opening WC2 is extracted from the layout shown in FIG. 6. FIG. 9 is a diagram in which the layout of the wiring W3 is extracted from the layout shown in FIG. 6. FIG. 10 is a diagram showing an example of a layout of the routing wiring part 115 overlapping wiring regions 27 to 29. FIG. 11 is a diagram in which the layout of the wiring W1 and the opening WC1 is extracted from the layout shown in FIG. 10. FIG. 12 is a diagram in which the layout of the wiring W2 and the opening WC2 is extracted from the layout shown in FIG. 10. FIG. 13 is a diagram in which the layout of the wiring W3 is extracted from the layout shown in FIG. 10. FIG. 14 is a cross-sectional view showing a cross-sectional configuration along A1-A2 shown in FIG. 6. FIG. 15 is a cross-sectional view showing a cross-sectional configuration along B1-B2 shown in FIG. 6. FIG. 16 is a cross-sectional view showing a cross-sectional configuration along C1-C2 shown in FIG. 6. FIG. 17 is a cross-sectional view showing a cross-sectional configuration along J1-J2 shown in FIG. 6. Configurations that are the same as or similar to those in FIG. 1 to FIG. 4 will be described as necessary.

First, a configuration of the routing wiring part 115 will be described with reference to FIG. 5. As shown in FIG. 5, the routing wiring part 115 partially overlaps the IC chip 400, is arranged between the IC chip 400 and the first driving circuit 110, and connects the IC chip 400 and the first driving circuit 110. As described in "1-1. Display Device 10", the routing wiring part 115 includes the plurality of data signal supply lines 1, and a plurality of terminals for connecting the IC chip 400 and the routing wiring part 115 overlap the IC chip 400. For example, the IC chip 400 is arranged on the array substrate 100 using a COG (Chip on Glass) method. The plurality of data signal supply lines 1 includes data signal supply lines 11 to 13, and the plurality of terminals includes the terminals 41 to 43.

The plurality of data signal supply lines 1 includes a plurality of data signal supply lines 1 for supplying a positive (+) data signal, and a plurality of data signal supply lines 1 for supplying a negative (−) data signal. Similar to the plurality of data signal supply lines 1, the plurality of terminals includes a plurality of terminals for supplying a positive (+) data signal and a plurality of terminals for supplying a negative (−) data signal.

In the case where the polarities of the plurality of data signal supply lines 1 are distinguished, the data signal supply lines are expressed as, for example, the data signal supply line 11 (+) and the data signal supply line 11 (−). In the case where the polarities of the plurality of data signal supply lines 1 are not distinguished, the (+) and (−) expressing the polarities of the data signal supply lines are omitted, and for example, the data signal supply lines are expressed as the data signal supply line 11 and the data signal supply line 12. Similar to the plurality of data signal supply lines 1, in the case where the polarities of the plurality of terminals are distinguished, each of the plurality of terminals is expressed as, for example, the terminal 41 (+) and the terminal 41 (−). Similar to the plurality of data signal supply lines 1, in the case where the polarities of the plurality of terminals are not distinguished, the (+) and (−) expressing the polarities of the terminals are omitted, and for example, the terminals are expressed as the terminal 41 and the terminal 42. That is, the data signal supply line 11 includes the data signal supply line 11 (+) and the data signal supply line 11 (−). The data signal supply lines 12 and 13 are similar to the data signal supply line 11. The terminal 41 includes the terminal 41 (+) and the terminal 41 (−). The terminals 42 and 43 are similar to the terminal 41.

Furthermore, for example, the positive (+) data signal supply line and the negative (−) data signal supply line are alternately arranged along the first direction D1 at a first end portion connected to the IC chip 400 of the plurality of data signal supply lines 1 and a second end portion connected to the first driving circuit 110 of the plurality of data signal supply lines 1. That is, if the first end portion is the end portion of the positive (+) data signal supply line, the second end portion is the end portion of the positive (+) data signal supply line. However, the positive (+) data signal supply line of the first end portion and the positive (+) data signal supply line of the second end portion may not be the same data signal supply line. Similar to the data signal supply line 1, for example, the plurality of terminals is arranged such that a positive (+) terminal and a negative (−) terminal are alternately arranged along the first direction D1.

Furthermore, for example, the positive (+) data signal is a signal having a polarity different from that of the negative data signal with reference to the ground voltage, the common voltage, or the like. For example, a driving method of the display device 10 is a so-called column-inversion driving method in which the positive (+) data signal and the negative (−) data signal are supplied to the adjacent data signal line 131. The driving method of the display device 10 can suppress degradation of each pixel caused by deviation of positive and negative charges between the adjacent pixel electrode PTCO.

In the example shown in FIG. 5, a first terminal of the data signal supply line 11 (+), a first terminal of the data signal supply line 11 (−), a first terminal of the data signal supply line 12 (+), a first terminal of the data signal supply line 12 (−), a first terminal of the data signal supply line 13 (+), and a first terminal of the data signal supply line 13 (−) are arranged in this order along the first direction D1 on the IC chip 400 side. A second terminal of the data signal supply line 11 (+), a second terminal of the data signal supply line 11 (−), a second terminal of the data signal supply line 12 (+), a second terminal of the data signal supply line 12 (−), a second terminal of the data signal supply line 13 (+), and a second terminal of the data signal supply line 13 (−) are arranged in this order along the second direction D2 on the first driving circuit 110 side. The terminal 41 (+), the terminal 41 (−), the terminal 42 (+), the terminal 42 (−), the terminal 43 (+), and the terminal 43 (−) are arranged in this order along the first direction D1.

The data signal supply line 1 includes the wiring W1, the opening WC1 for connecting the wiring W1 and the wiring W2, the wiring W2, and the opening WC2 for connecting the wiring W2 and the wiring W3, and the wiring W3. Each of the plurality of data signal supply lines 1 extends in a direction inclined with respect to the first direction D1. The inclination of each of the plurality of data signal supply lines 1 and layer structures of the wiring W1, the wiring W2, and the wiring W3 constituting the plurality of data signal supply lines 1 are different from each other.

In addition, as shown in FIG. 5, the routing wiring part 115 overlaps a wiring region 21 adjacent to the first driving circuit 110, a wiring region 22 adjacent to the wiring region 21, the wiring region 23 adjacent to the wiring region 22, the wiring region 24 adjacent to the wiring region 23, the wiring region 25 adjacent to the wiring region 24, a wiring region 26 adjacent to the wiring region 25, the wiring region 27 adjacent to the wiring region 26, the wiring region 28 adjacent to the wiring region 27, and the wiring region 29 arranged between the wiring region 28 and the IC chip 400 and adjacent to the wiring region 29.

The plurality of data signal supply lines 1 in the wiring region 21 is formed of the wiring W2. That is, the plurality of data signal supply lines 1 in the wiring region 21 does not include the wiring W1 and the wiring W3. The plurality of data signal supply lines 1 in the wiring region 22 is formed of the wiring W1, the wiring W2, and the wiring W3, and the connection between some of the plurality of data signal supply lines 1 are changed. Each of the plurality of data signal supply lines 1 in the wiring region 23 is formed of a wiring of any one of the wiring W1, the wiring W2, and the wiring W3. The plurality of data signal supply lines 1 in the wiring region 24 is formed of two or more wirings among the wiring W1, the wiring W2, or the wiring W3, and the connection between the plurality of data signal supply lines 1 is changed. Each of the plurality of data signal supply lines 1 in the wiring region 25 is formed of a wiring of any one of the wiring W1, the wiring W2, and the wiring W3. Similar to the plurality of data signal supply lines 1 in the wiring region 24, the plurality of data signal supply lines 1 in the wiring region 26 is formed of two or more wirings among the wiring W1, the wiring W2, and the wiring W3, and the connection between the plurality of data signal supply lines 1 is changed. Each of the plurality of data signal supply lines 1 in the wiring region 27 is formed of a wiring of any one of the wiring W1, the wiring W2, and the wiring W3. The plurality of data signal supply lines 1 in the wiring region 28 is formed of the wiring W1, the wiring W2, and the wiring W3, and the connection between some of the plurality of data signal supply lines 1 are changed. Similar to the data signal supply lines 1 in the wiring region 21, the plurality of data signal supply lines 1 in the wiring region 29 is formed of the wiring W2 and does not include the wiring W1 and the wiring W3.

Next, a connection configuration of the data signal supply line 13 (+) in each region will be described as an example. The data signal supply line 13 (+) in the wiring region 21 is formed of the wiring W2. The data signal supply line 13 (+) in the wiring region 22 is formed of the wiring W2, the opening WC1 for connecting the wiring W2 and the wiring W1, and the wiring W1. That is, the connection of the data signal supply line 13 (+) in the wiring region 22 is changed from the wiring W2 to the wiring W1. The data signal supply line 13 (+) in the wiring region 23 is formed of the wiring W1. The data signal supply line 13 (+) in the wiring region 24 is formed of the wiring W1, the opening WC1 for connecting the wiring W1 and the wiring W2, the opening WC2 for connecting the wiring W2 and the wiring W3, and the wiring W3. That is, the connection of the data signal supply line 13 (+) in the wiring region 24 is changed from the wiring W1 to the wiring W3. The data signal supply line 13 (+) in the wiring region 25 is formed of the wiring W3. The data signal supply line 13 (+) in the wiring region 26 is formed of the wiring W3, the opening WC2 for connecting the wiring W3 and the wiring W2, and the wiring W2. That is, the connection of the data signal supply line 13 (+) in the wiring region 26 is changed from the wiring W3 to the wiring W2. The data signal supply line 13 (+) in the wiring region 27, the wiring region 28, and the wiring region 29 is formed of the wiring W2. As described above, the data signal supply line 13 (+) is connected to the first driving circuit 110 and the terminal 43 (+) and is connected to the IC chip 400.

Furthermore, in the example shown in FIG. 5, in order to explain the data signal supply line in an easy-to-understand manner, there is a region where the data signal supply line 11 (+), the data signal supply line 11 (−), the data signal supply line 12 (+), the data signal supply line 12 (−), the data signal supply line 13 (+), or the data signal supply line 13 (−) is shown to be inclined with respect to the first direction D1 in each region from the wiring region 22 to the wiring region 29. The actual arrangement will be described later with reference to FIG. 6 to FIG. 29.

1-5-1. Example of Plane (Layout) of Data Signal Supply Line 1

Next, an example of a plane (layout) of the plurality of data signal supply lines 1 in the wiring region 23 to the wiring region 25 will be described as an example with reference to FIG. 6 to FIG. 9. In addition, an example of a plan view (layout) of the plurality of data signal supply lines 1 in the wiring region 27 to the wiring region 29 will be described as an example with reference to FIG. 10 to FIG. 13. The plurality of data signal supply lines 1 actually includes more supply lines than the supply lines shown in FIG. 6 to FIG. 13. The examples shown in FIG. 6 to FIG. 13 show the layouts of the data signal supply line 13 (+), the data signal supply line 12 (+), the data signal supply line 11 (+), the data signal supply line 13 (−), the data signal supply line 12 (−), and the data signal supply line 11 (−). The layouts of the data signal supply line 13 (−), the data signal supply line 12 (−), and the data signal supply line 11 (−) are similar to the layouts of the data signal supply line 13 (+), the data signal supply line 12 (+), and the data signal supply line 11 (+). The layouts of the data signal supply line 13 (+), the data signal supply line 12 (+), and the data signal supply line 11 (+) will be described here, and the layouts of the data signal supply line 13 (−), the data signal supply line 12 (−), and the data signal supply line 11 (−) will be described as necessary.

The case where the number of the openings WC1 and the openings WC2 forming the plurality of data signal supply lines 1 shown in FIG. 6 to FIG. 13 is one or two is exemplified. The number of the openings WC1 and the number of the openings WC2 is not limited to one or two, and may be at least one, and may be appropriately selected depending on the application and specifications of the display device 10, the density of routing of wiring, and the like.

As shown in FIG. 6, in a plan view, the data signal supply line 13 (+), the data signal supply line 12 (+), and the data signal supply line 11 (+) are inclined and overlap each other in part of the wiring region 23 and part of the wiring region 25. Line widths of the data signal supply line 13 (+), the data signal supply line 12 (+), the data signal supply line 11 (+), the data signal supply line 13 (−), the data signal supply line 12 (−), and the data signal supply line 11 (−) are a width LW1. Furthermore, in a plan view, the data signal supply line 13 (+), the data signal supply line 12 (+), and the data signal supply line 11 (+) are arranged at a distance from the data signal supply line 13 (−), the data signal supply line 12 (−), and the data signal supply line 11 (−) at the same interval. Although each embodiment shows an example in which line widths of the data signal supply line 13 (+), the data signal supply line 12 (+), the data signal supply line 11 (+), the data signal supply line 13 (−), the data signal supply line 12 (−), and the data signal supply line 11 (−) are the width LW1, the present invention is not limited to the example shown here. For example, line widths of the overlapping data signal supply lines among the plurality of data signal supply lines may be the same, and line widths of the non-overlapping data signal supply lines among the plurality of data signal supply lines may be different.

As shown in FIG. 6, FIG. 7, FIG. 8, or FIG. 9, in the data signal supply line 13 (+), the wiring W1 is arranged so as to be inclined with respect to the first direction D1 in the wiring region 23 and to be positioned substantially parallel along the second direction D2 in the wiring region 24. The opening WC1 is arranged on the wiring W1 along the third direction D3 in the wiring region 24 (see FIG. 15). The wiring W2 is arranged in the wiring region 24 so as to overlap the wiring W1 and the opening WC1 and to be positioned substantially parallel along the first direction D2. That is, the wiring W2 is connected to the wiring W1 via the opening WC1. The opening WC2 is arranged on the wiring W2 along the third direction D3 in the wiring region 24 (see FIG. 15). The wiring W3 is arranged so as to overlap the wiring W2, and the opening WC2 and to be positioned substantially parallel along the second direction D2 in the wiring region 24, and to be inclined with respect to the first direction D1 in the wiring region 25. That is, the wiring W3 is connected to the wiring W2 via the opening WC2. As described above, the connection of the data signal supply line 13 (+) is changed from the wiring W1 to the wiring W3.

As shown in FIG. 6, FIG. 7, or FIG. 8, in the data signal supply line 12 (+), the wiring W2 is arranged so as to be inclined with respect to the first direction D1 in the wiring region 23 and to be positioned substantially parallel along the second direction D2 in the wiring region 24. The wiring W1 is arranged so as to be positioned substantially parallel along the second direction D2 in the wiring region 24 and to be inclined with respect to the first direction D1 in the wiring region 25. The opening WC1 is arranged on the wiring W1 along the third direction D3 in the wiring region 24 (see FIG. 16). That is, the wiring W2 is connected to the wiring W1 via the opening WC1. As described above, the connection of the data signal supply line 12 (+) is changed from the wiring W2 to the wiring W1.

As shown in FIG. 6, FIG. 8, or FIG. 9, in the data signal supply line 11 (+), the wiring W3 is arranged so as to be inclined with respect to the first direction D1 in the wiring region 23, and to be positioned substantially parallel along the second direction D2 in the wiring region 24. The wiring W2 is routed so as to be positioned substantially parallel along the second direction D2 in the wiring region 24, and to be inclined with respect to the first direction D1 in the wiring region 25. In addition, the opening WC2 is arranged on the wiring W2 along the third direction D3 in the wiring region 24 (see FIG. 17). That is, the wiring W3 is connected to the wiring W2 via the opening WC2. As described above, the connection of the data signal supply line 11 (+) is changed from the wiring W3 to the wiring W2.

As shown in FIG. 10, in part of the wiring region 27, the data signal supply line 13 (+), the data signal supply line 12 (+), and the data signal supply line 11 (+) are inclined and overlap each other. That is, the data signal supply line 13 (+), the data signal supply line 12 (+), and the data signal supply line 11 (+) are arranged parallel to each other.

As shown in FIG. 10 and FIG. 12, in the data signal supply line 13 (+), the wiring W2 is arranged so as to be inclined with respect to the first direction D1 in the wiring region 27 and substantially parallel along the second direction D2 in the wiring region 28 and the wiring region 29. As described above, the connection of the wiring of the data signal supply line 13 (+) in the wiring region 27, the wiring region 28 and the wiring region 29 is not changed.

As shown in FIG. 10, FIG. 12, or FIG. 13, in the data signal supply line 12 (+), the wiring W3 is inclined with respect to the first direction D1 in the wiring region 27, and is arranged substantially parallel along the second direction D2 in the wiring region 28. The wiring W2 is arranged so as to be positioned substantially parallel along the second direction D2 in the wiring region 28 and the wiring region 29. Two openings WC2 are arranged on the wiring W1 along the third direction D3 in the wiring region 28. That is, the wiring W3 is connected to the wiring W2 via the opening WC2. As described above, the connections of the wiring of the data signal supply lines 12 (+) in the wiring region 27, the wiring region 28, and the wiring region 29 are changed from the wiring W3 to the wiring W2.

As shown in FIG. 10, FIG. 11, or FIG. 12, in the data signal supply line 11 (+), the wiring W1 is inclined with respect to the first direction D1 in the wiring region 27, and is arranged substantially parallel along the second direction D2 in the wiring region 28. The wiring W2 is arranged so as to be positioned substantially parallel along the second direction D2 in the wiring region 28 and the wiring region 29. Two openings WC1 are arranged on the wiring W1 along the third direction D3 in the wiring region 28. That is, the wiring W2 is connected to the wiring W1 via the opening WC1. As described above, the connection of the data signal supply line 11 (+) is changed from the wiring W1 to the wiring W2.

1-5-2. Example of Cross-Sectional Structure of Data Signal Supply Line 1

Next, a cross-sectional structure of the plurality of data signal supply lines 1 in the wiring region 23, the wiring region 24, and the wiring region 25 will be described as an example with reference to FIG. 14 to FIG. 17.

As shown in FIG. 14, the data signal supply line 13 (+) in the wiring region 23 is formed of the wiring W1 arranged on the substrate SUB. The data signal supply line 12 (+) in the wiring region 23 is formed of the wiring W2 arranged on the gate insulating layer GI1. The data signal supply line 11 (+) in the wiring region 23 is formed of the wiring W3 arranged on the insulating layer IL2. For example, the data signal supply line 13 (+), the data signal supply line 12 (+), and the data signal supply line 11 (+) have the same width LW1 and overlap in the third direction D3.

The data signal supply line 13 (−) in the wiring region 23 is arranged in the same layer as the data signal supply line 13 (+), the data signal supply line 12 (−) is arranged in the same layer as the data signal supply line 12 (+), the data signal supply line 11 (−) is arranged in the same layer as the data signal supply line 11 (+), and the data signal supply line 13 (−), the data signal supply line 12 (−), and the data signal supply line 11 (−) in the wiring region 23 have a similar configuration as the data signal supply line 13 (+), the data signal supply line 12 (+), and the data signal supply line 11 (+).

An interval between the data signal supply line 13 (−) and the data signal supply line 13 (+), an interval between the data signal supply line 12 (−) and the data signal supply line 12 (+), and an interval between the data signal supply line 11 (−) and the data signal supply line 11 (+) are the same.

As shown in FIG. 15, on the wiring region 23 side, the data signal supply line 13 (+) formed using the wiring W1, the data signal supply line 12 (+) formed using the wiring W2, and the data signal supply line 11 (+) formed using the wiring W3 are stacked in this order from the substrate SUB side upward in the third direction and overlap each other. The data signal supply line 13 (+) is configured using the wiring W1, the opening WC1 that opens the gate insulating layer GI1, the insulating layer IL1, and the gate insulating layer GI2, the wiring W2, the opening WC2 that opens the insulating layer IL2, and the wiring 3, and the connection is changed from the wiring W1 on the wiring region 23 side formed on the substrate SUB to the wiring W3 on the wiring region 25 side formed above the wiring W1.

As shown in FIG. 16, on the wiring region 23 side, the data signal supply line 12 (+) formed using the wiring W2 and the data signal supply line 11 (+) formed using the wiring W3 are stacked in this order from the substrate SUB side upward in the third direction and overlap each other. The data signal supply line 12 (+) is configured using the wiring W2, the opening WC1 that opens the gate insulating layer GI1, the insulating layer IL1, and the gate insulating layer GI2, and the wiring W1, and the connection from the wiring W2 on the wiring region 23 side formed on the substrate SUB is changed to the wiring W1 on the wiring region 25 side formed closer to the substrate SUB than the wiring W2. In addition, on the wiring region 25 side, the data signal supply line 11 (+) formed using the wiring W1 and the data signal supply line 13 (+) formed using the wiring W3 are stacked in this order from the substrate SUB side upward in the third direction and overlap each other.

As shown in FIG. 17, the data signal supply line 11 (+) formed using the wiring W3 is arranged on the wiring region 23 side. The data signal supply line 11 (+) is configured using the wiring W3, the opening WC2 that opens the insulating layer IL2, and the wiring W2, and the connection from the wiring W3 on the wiring region 23 side is changed to the wiring W2 on the wiring region 25 formed closer to the substrate SUB side than the wiring W3. In addition, on the wiring region 25 side, the data signal supply line 12 (+) formed using the wiring W1, the data signal supply line 11 (+) formed using the wiring W2, and the data signal supply line 13 (+) formed using the wiring W3 are stacked in this order from the substrate SUB side upward in the third direction and overlap each other.

The display device 10 overlaps the display region 122, is used in the pixel circuit 182, overlaps the transistor Tr1 including the oxide semiconductor layer OS, overlaps the peripheral region 121, is used in the first driving circuit 110 and the second driving circuit 120, and includes the transistor Tr2 including the semiconductor layer S. For example, the material forming the semiconductor layer S is polysilicon, and the material forming the oxide semiconductor layer OS is a material other than polysilicon. As a result, the display device 10 can use the transistor including the semiconductor layer S and the oxide semiconductor layer OS in a suitable region.

In addition, the display device 10 includes the wiring W1 formed in the same layer as the gate electrode GL2 of the transistor Tr2, the wiring W2 formed in the same layer as the gate electrode GL1 of the transistor Tr1, and the wiring W3 formed in the same layer as the source electrode or drain electrode of the transistor Tr2 and the transistor Tr1.

The routing wiring part 115 of the display device 10 may be stacked and arranged by stacking the signal lines of the same polarity using three layers of differing wirings (the wiring W1, the wiring W2, and the wiring W3).

As a result, the routing wiring part 115 of the display device 10 has a configuration capable of reducing parasitic capacitance compared with a configuration in which different polarities are stacked and arranged and suppressing differences in resistance between the wirings.

In addition, the routing wiring part 115 of the display device 10 may be arranged by stacking the signal lines of the same polarity using the three layers of differing wirings (the wiring W1, the wiring W2 and the wiring W3) and the connection of the signal lines using the three different wirings and the two different openings (the opening WC1 and the opening WC2) is changed.

As a result, the routing wiring part 115 of the display device 10 has a higher degree of freedom in routing wiring compared with a configuration using two or fewer layers of wiring and the signal line can be efficiently arranged. In addition, the area of the routing wiring part 115 of the display device 10 can be reduced compared with the routing wiring part including the configuration using wiring of two layers or less.

In addition, in the display device 10, the data signal supply lines having different polarities formed in the same layer can be arranged at a distance from each other. That is, the display device 10 has a space between the wirings, and for example, when UV is applied to the sealing part 200, the sealing part 200 can be efficiently cured by using the space between the wirings, and the array substrate 100 and the counter substrate 190 can be bonded to each other.

2. Second Embodiment

A configuration of the routing wiring part 115 of the display device 10 according to a second embodiment will be described with reference to FIG. 5, FIG. 18, and FIG. 29. The configuration of the routing wiring part 115 of the display device 10 according to the second embodiment is different from the configuration of the routing wiring part 115 of the display device 10 according to the first embodiment in that the wiring W3 does not overlap the wiring W1 and the wiring W2. The other configurations are the same as the configurations of the routing wiring part 115 of the display device 10 according to the first embodiment. Therefore, the configuration different from the configuration of the routing wiring part 115 of the display device 10 according to the first embodiment will be described in the configuration of the routing wiring part 115 of the display device 10 according to the second embodiment, and a similar configuration as the configuration of the routing wiring part 115 of the display device 10 according to the first embodiment will be described as necessary.

Figure 19:
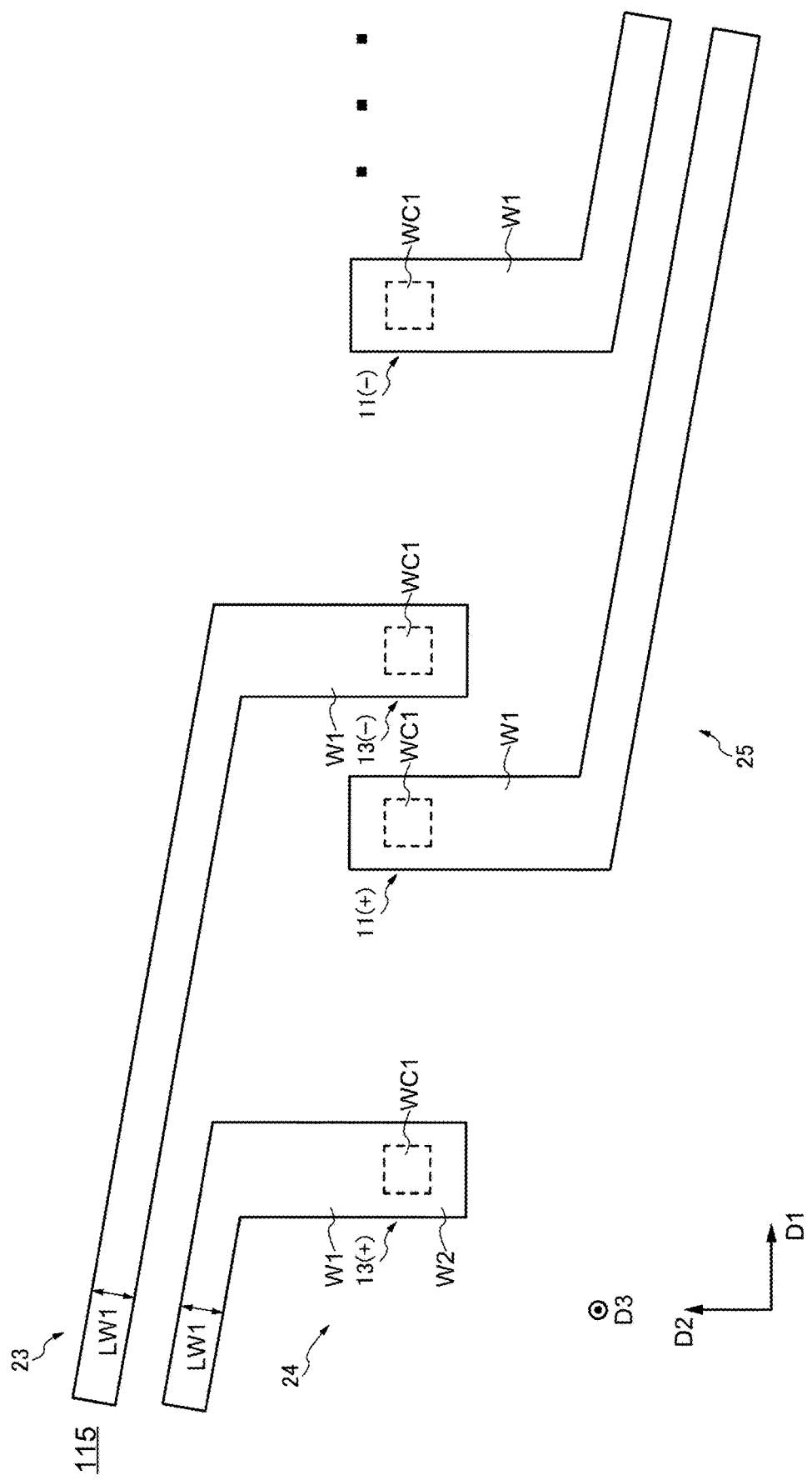
FIG. 19 is a diagram showing an example of a layout of a routing wiring part according to the second embodiment of the present invention.
Figure 20:
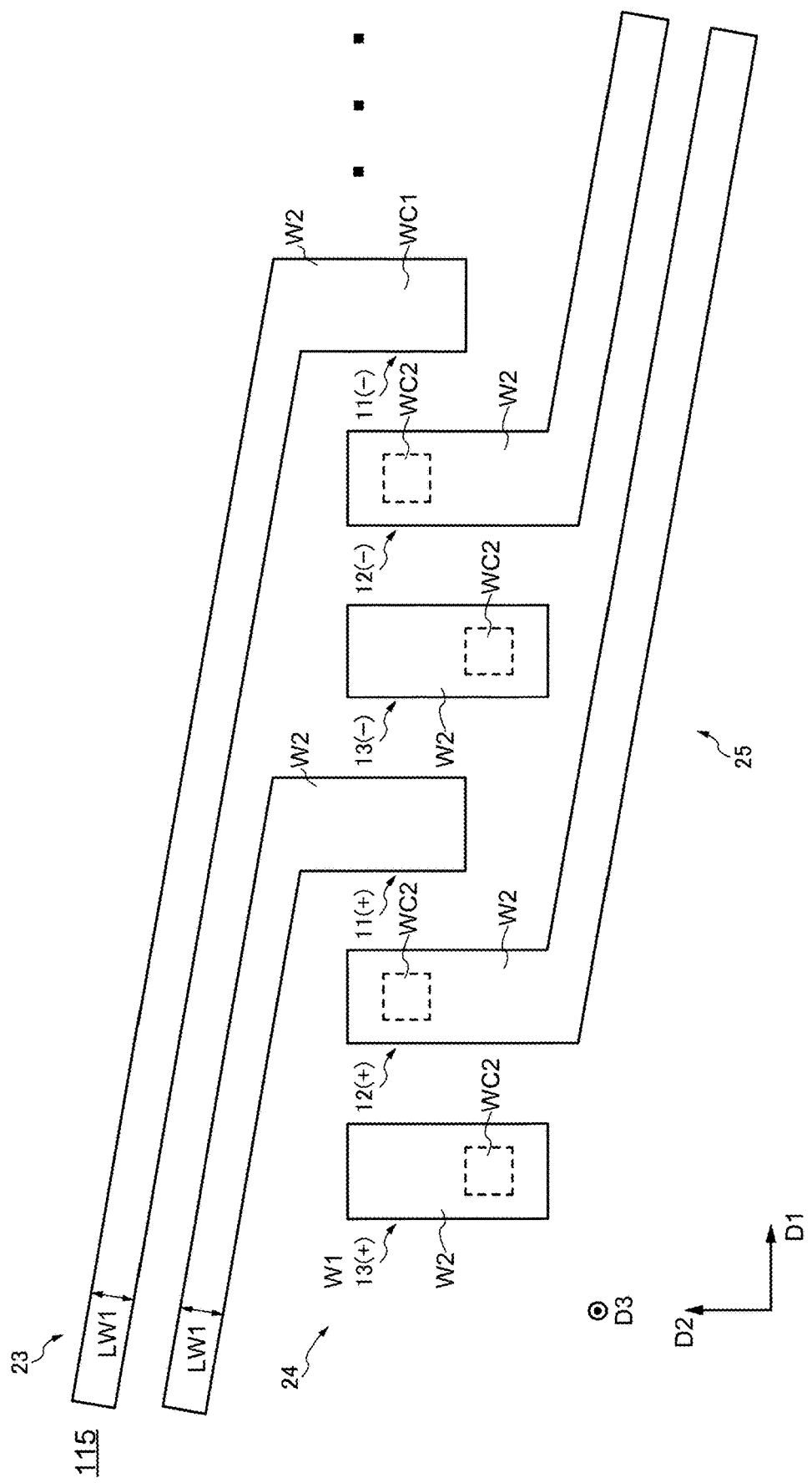
FIG. 20 is a diagram showing an example of a layout of a routing wiring part according to the second embodiment of the present invention.
Figure 21:
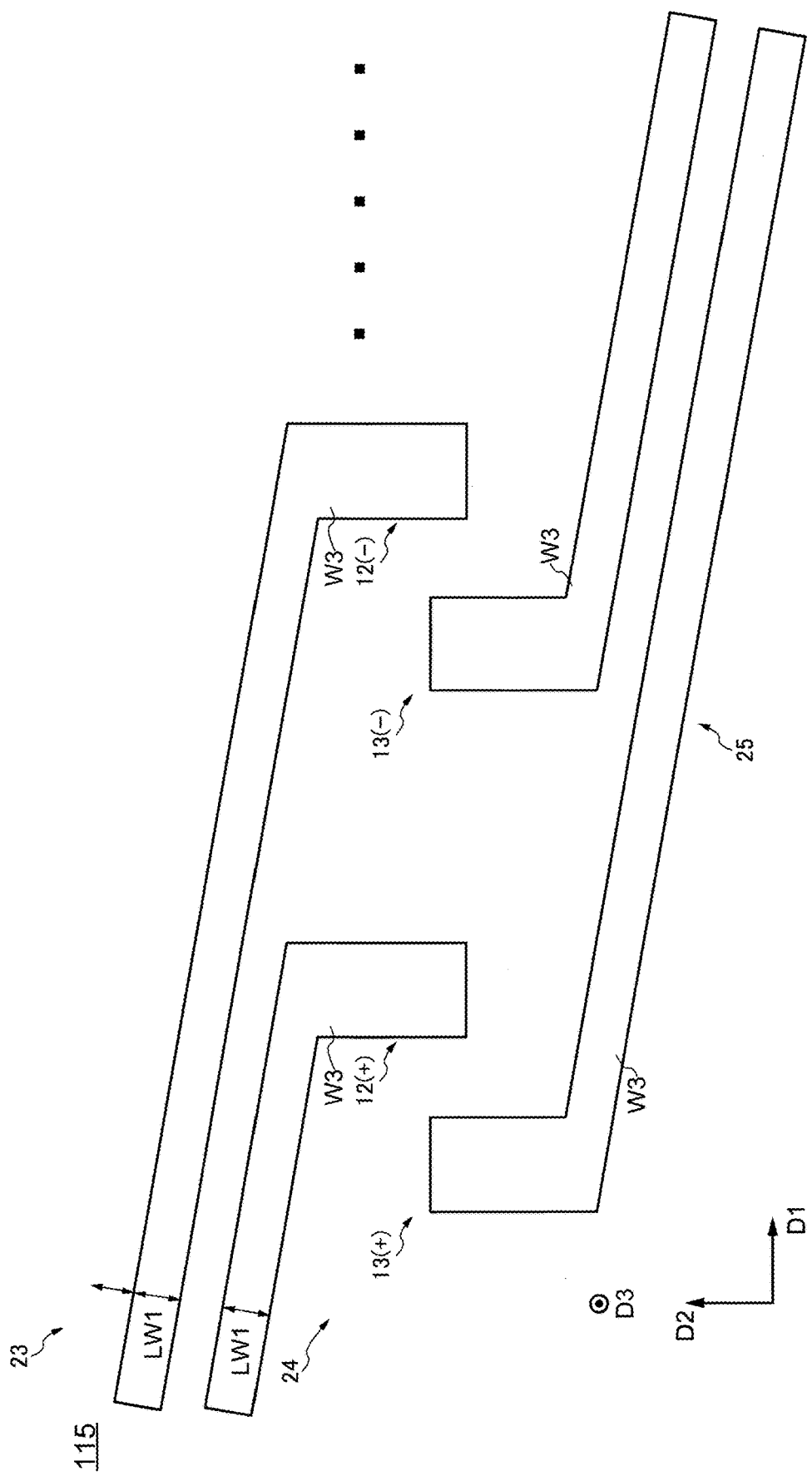
FIG. 21 is a diagram showing an example of a layout of a routing wiring part according to the second embodiment of the present invention.
Figure 22:
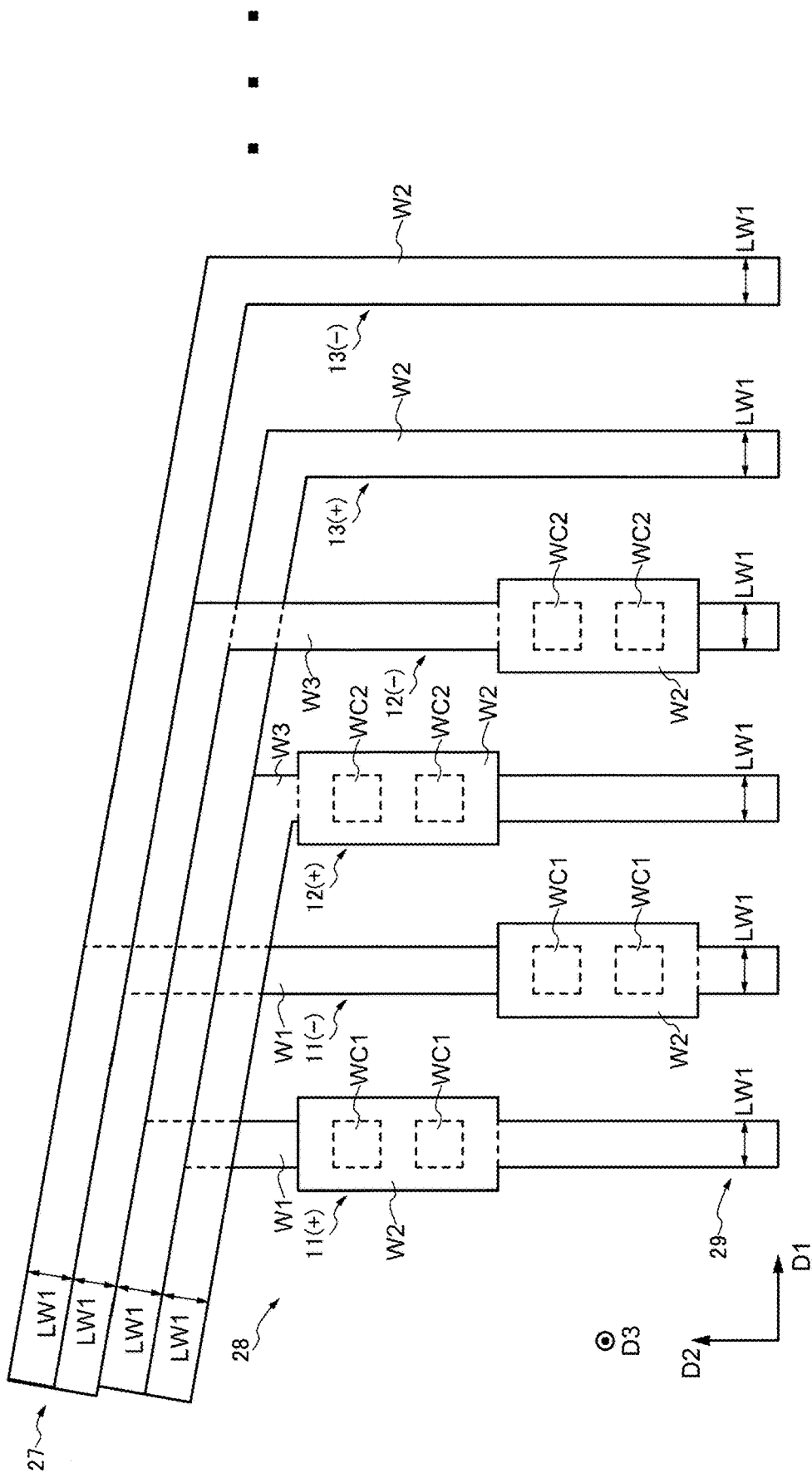
FIG. 22 is a diagram showing an example of a layout of a routing wiring part according to the second embodiment of the present invention.
Figure 23:
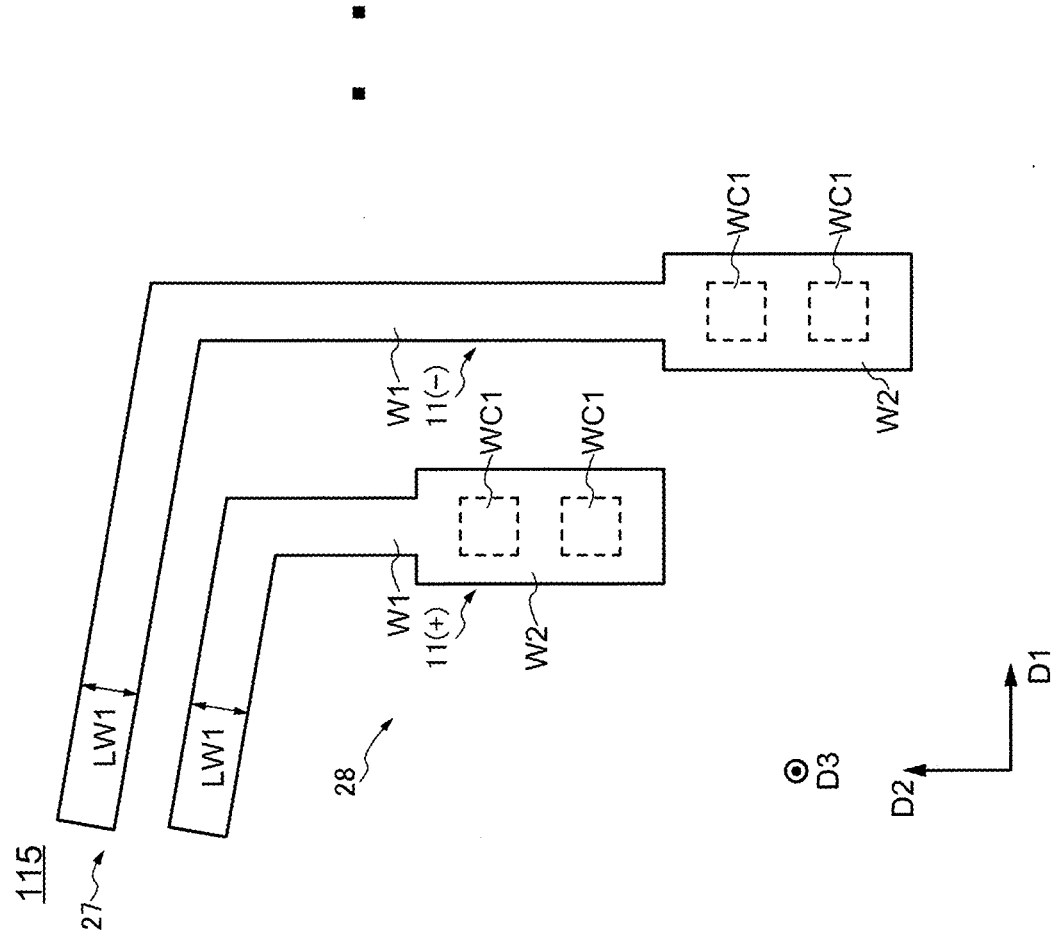
FIG. 23 is a diagram showing an example of a layout of a routing wiring part according to the second embodiment of the present invention.
Figure 24:
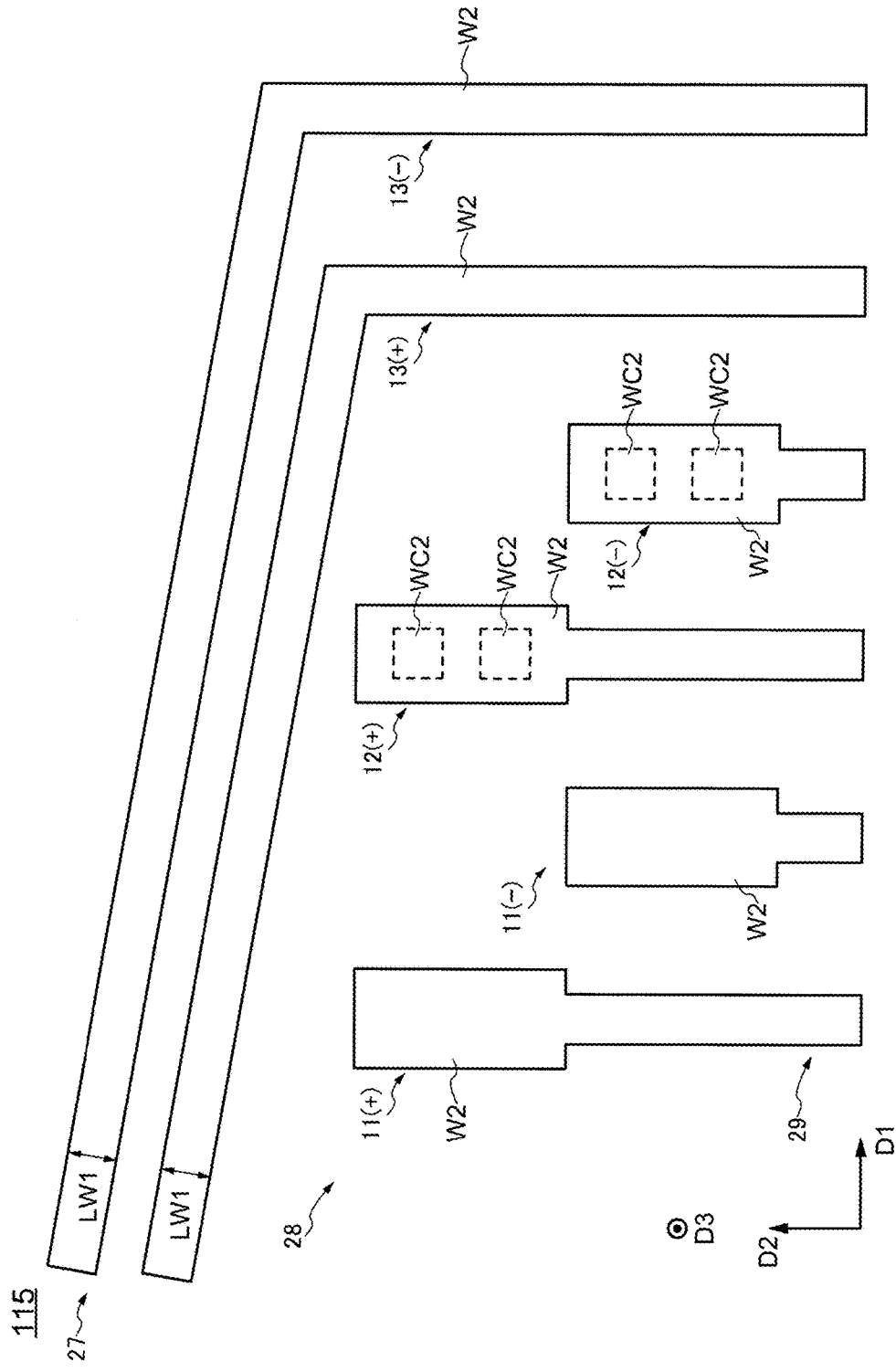
FIG. 24 is a diagram showing an example of a layout of a routing wiring part according to the second embodiment of the present invention.
Figure 25:
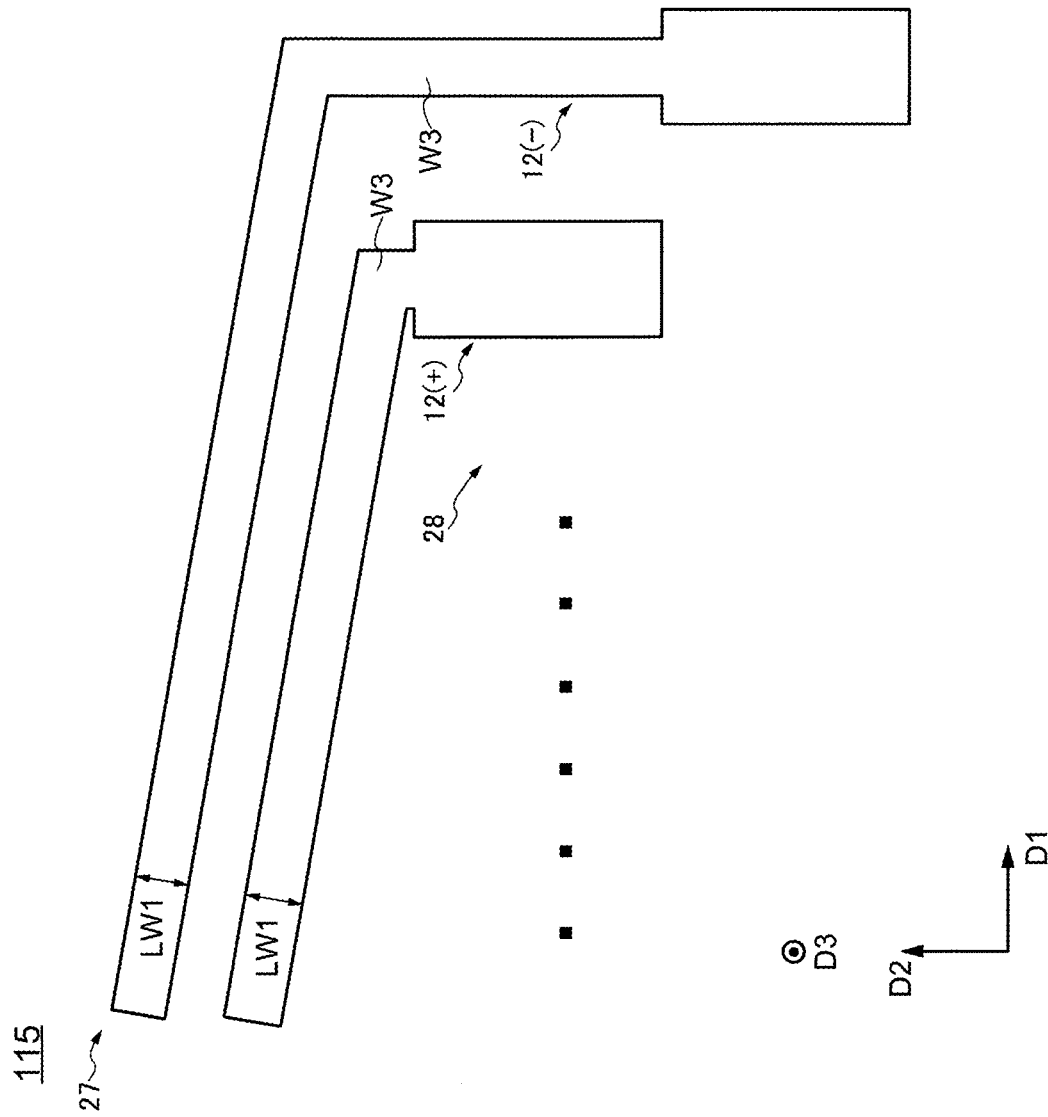
FIG. 25 is a diagram showing an example of a layout of a routing wiring part according to the second embodiment of the present invention.
Figure 26:
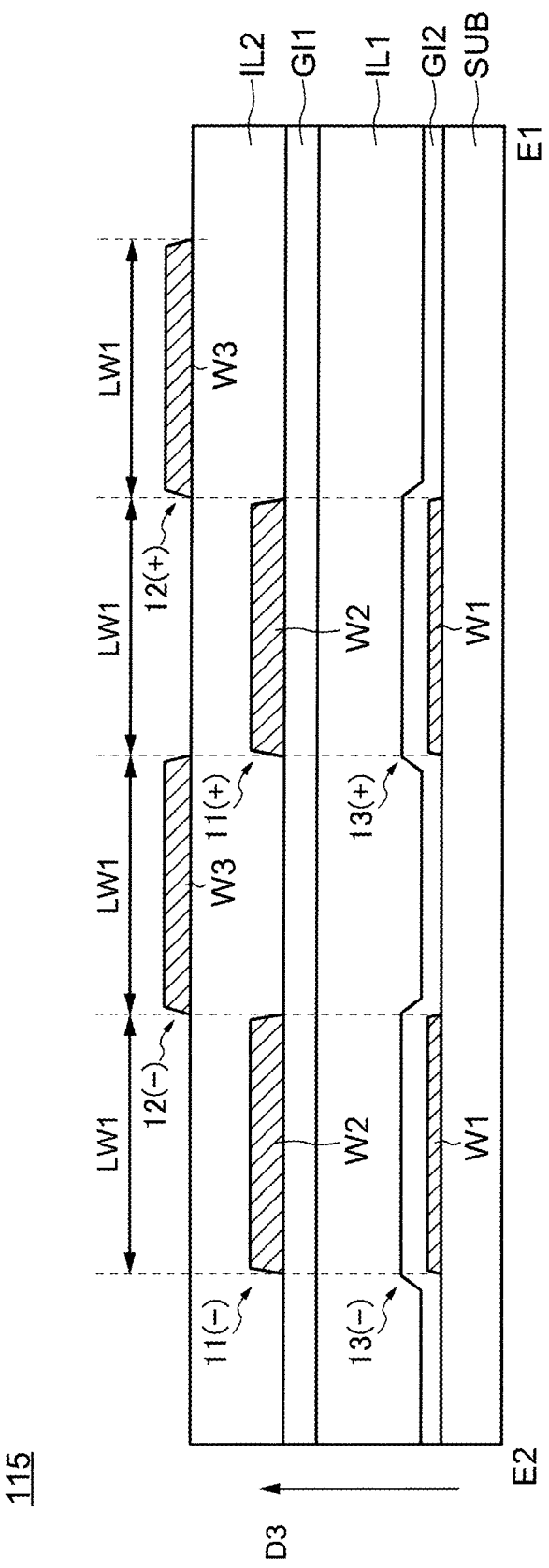
FIG. 26 is a cross-sectional view showing a cross-sectional structure along E1-E2 shown in FIG. 18.
Figure 27:
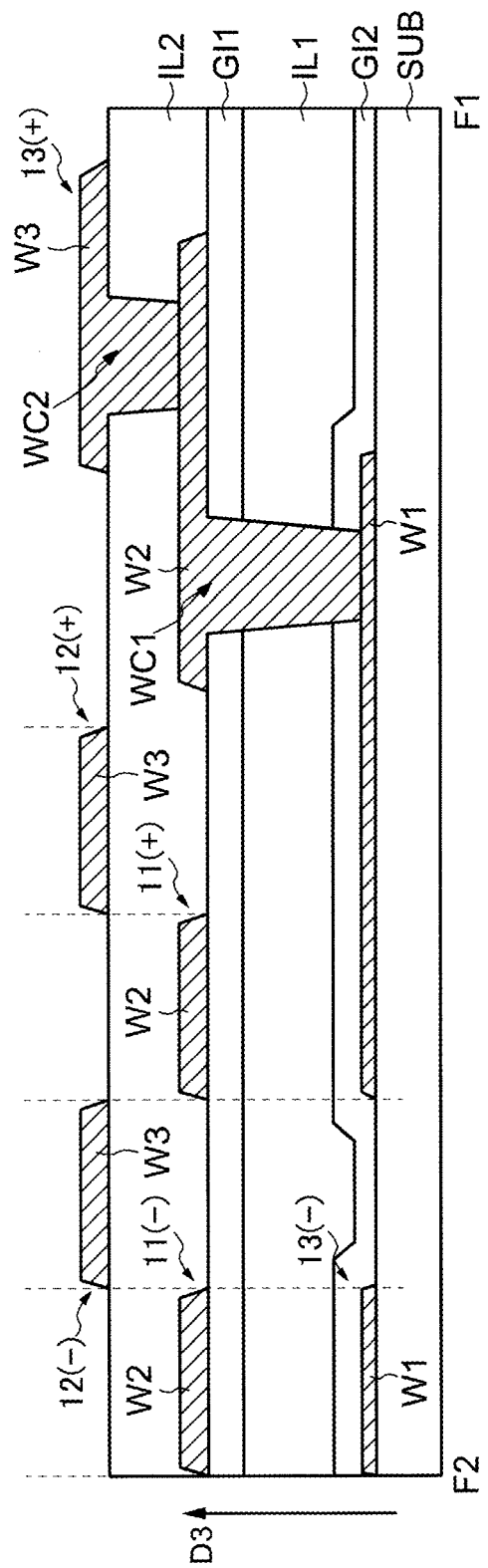
FIG. 27 is a cross-sectional view showing a cross-sectional structure along F1-F2 shown in FIG. 18.
Figure 28:
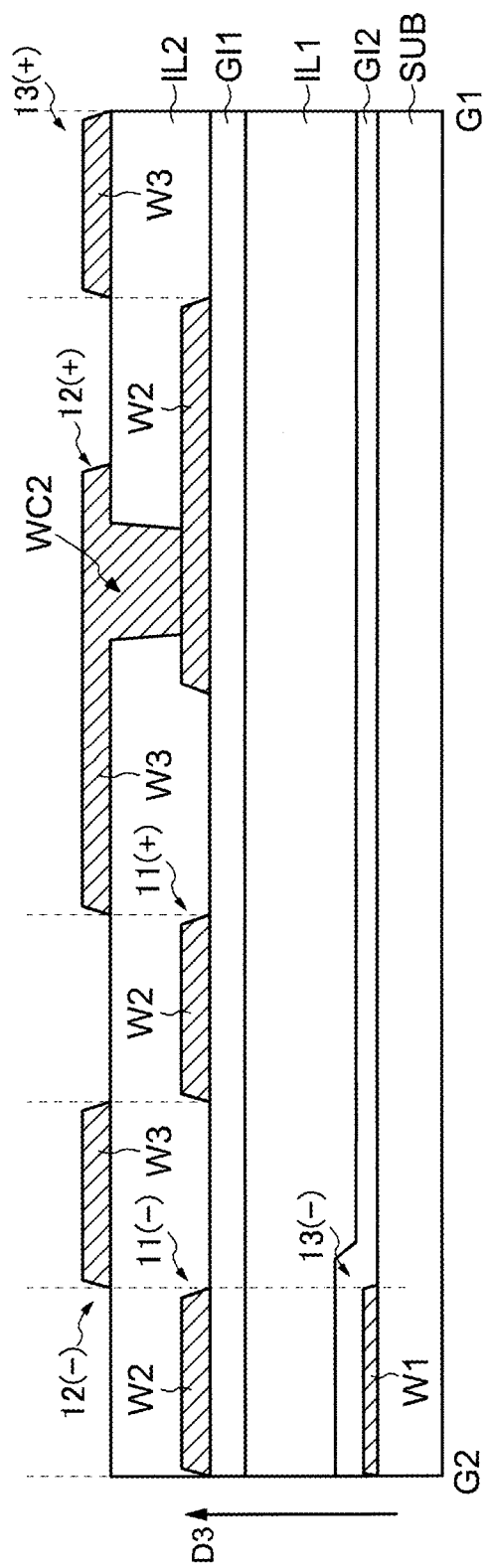
FIG. 28 is a cross-sectional view showing a cross-sectional structure along G1-G2 shown in FIG. 18.

Similar to the first embodiment, FIG. 5 is a schematic diagram showing a configuration of the routing wiring part 115. FIG. 18 is a diagram showing an example of a layout of the routing wiring part 115 overlapping the wiring regions 23 to 25. FIG. 19 is a diagram in which the layout of the wiring W1 and the opening WC1 is extracted from the layout shown in FIG. 18. FIG. 20 is a diagram in which the layout of the wiring W2 and the opening WC2 is extracted from the layout shown in FIG. 18. FIG. 21 is a diagram in which the layout of the wiring W3 is extracted from the layout shown in FIG. 18. FIG. 22 is a diagram showing an example of the layout of the routing wiring part 115 overlapping the wiring regions 27 to 29. FIG. 23 is a diagram in which the layout of the wiring W1 and the opening WC1 is extracted from the layout shown in FIG. 22. FIG. 24 is a diagram in which the layout of the wiring W2 and the opening WC2 is extracted from the layout shown in FIG. 22. FIG. 25 is a diagram in which the layout of the wiring W3 is extracted from the layout shown in FIG. 22. FIG. 26 is a cross-sectional view showing a cross-sectional structure along E1-E2 shown in FIG. 18. FIG. 27 is a cross-sectional view showing a cross-sectional structure along F1-F2 shown in FIG. 18. FIG. 28 is a cross-sectional view showing a cross-sectional structure along G1-G2 shown in FIG. 18. FIG. 29 is a cross-sectional view showing a cross-sectional structure along H1-H2 shown in FIG. 18. Configurations that are the same as or similar to those in FIG. 1 to FIG. 17 will be described as necessary.

2-1. Example of Plane (Layout) of Data Signal Supply Line 1

Next, an example of a plane (layout) of the plurality of data signal supply lines 1 in the wiring region 23 to the wiring region 25 will be described as an example with reference to FIG. 18 to FIG. 21. In addition, an example of a plane (layout) of the plurality of data signal supply lines 1 in the wiring region 27 to the wiring region 29 will be described as an example with reference to FIG. 22 to FIG. 25. Similar to the first embodiment, the plurality of data signal supply lines 1 actually include more supply lines than the supply lines shown in FIG. 18 to FIG. 25. In addition, similar to the first embodiment, the layouts of the data signal supply line 13 (−), the data signal supply line 12 (−), and the data signal supply line 11 (−) are the same as the layouts of the data signal supply line 13 (+), the data signal supply line 12 (+), and the data signal supply line 11 (+). Here, the layouts of the data signal supply line 13 (+), the data signal supply line 12 (+), and the data signal supply line 11 (+) will be described, and the layouts of the data signal supply line 13 (−), the data signal supply line 12 (−), and the data signal supply line 11 (−) will be described as necessary.

Furthermore, the configurations of the data signal supply line 13 (+), the data signal supply line 12 (+), the data signal supply line 11 (+), the data signal supply line 13 (−), the data signal supply line 12 (−), and the data signal supply line 11 (−) in the wiring region 21 and the wiring region 22 according to the second embodiment are the same as the configurations of the data signal supply lines in the wiring region 21 and the wiring region 22 according to the first embodiment. Therefore, a detailed description will be omitted. In addition, the connection between the data signal supply line 13 (+), the data signal supply line 12 (+), the data signal supply line 11 (+), the data signal supply line 13 (−), the data signal supply line 12 (−) and the data signal supply line 11 (−) according to the second embodiment and the first driving circuit 110, each terminal (for example, the terminals 41 (+) to 41 (−)), and the IC chip 400 is similar to the connection between the data signal supply lines according to the first embodiment and the first driving circuit 110, each terminal (for example, the terminals 41 (+) to 41 (−)), and the IC chip 400. Therefore, a detailed description will be omitted.

Figure 18:
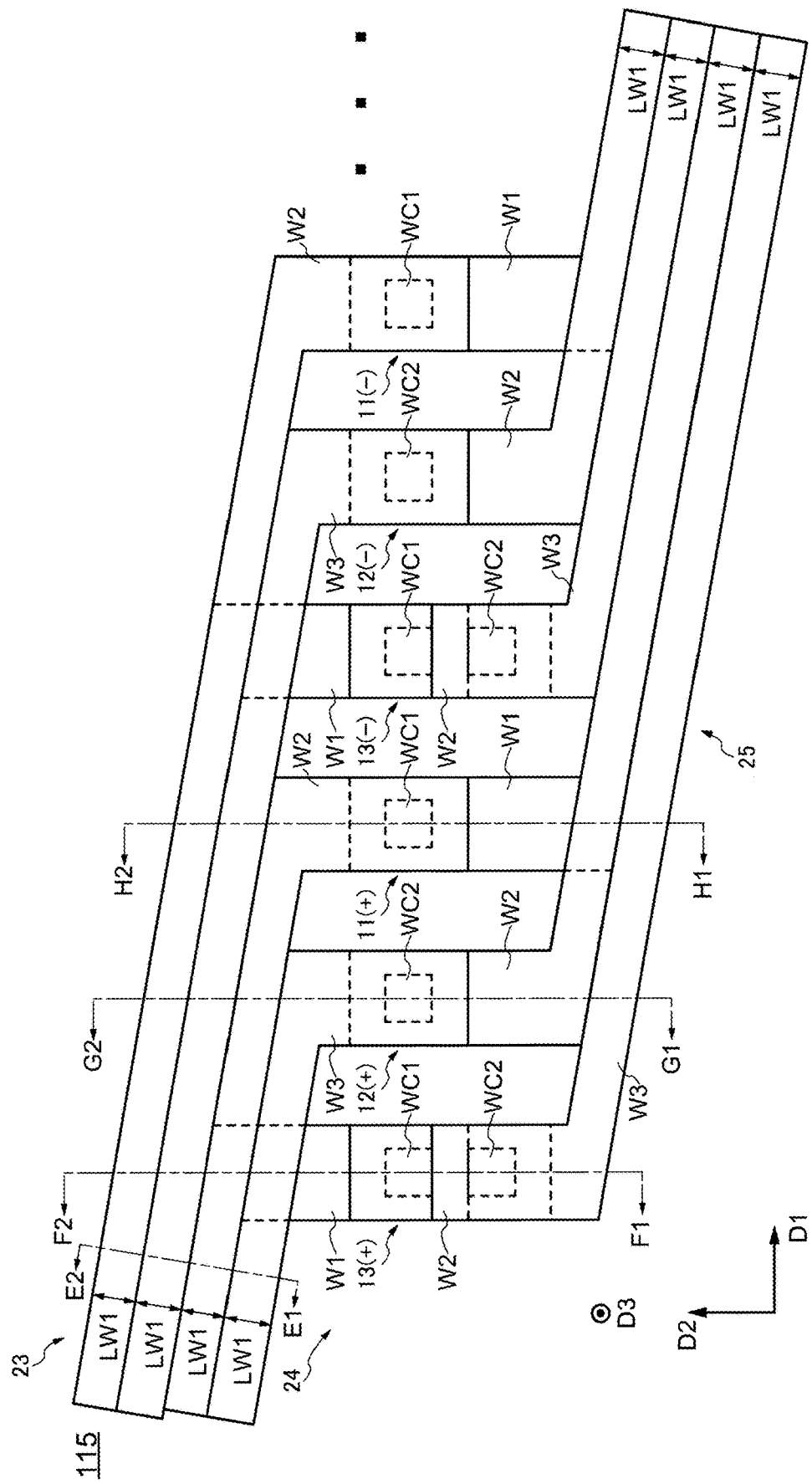
FIG. 18 is a diagram showing an example of a layout of a routing wiring part according to a second embodiment of the present invention.

As shown in FIG. 18, in a plan view, in part of the wiring region 23 and part of the wiring region 25, the data signal supply line 13 (+), the data signal supply line 12 (+), and the data signal supply line 11 (+) are inclined, the data signal supply line 13 (+) and the data signal supply line 11 (+) overlap each other and are spaced apart from the data signal supply line 12 (+), and the data signal supply line 13 (+) and the data signal supply line 11 (+) are arranged so as to be adjacent to the data signal supply line 12 (+). Line widths of the data signal supply line 13 (+), the data signal supply line 12 (+), the data signal supply line 11 (+), the data signal supply line 13 (−), the data signal supply line 12 (−), and the data signal supply line 11 (−) are the width LW1. In addition, as described with reference to FIG. 6, line widths of the overlapping data signal supply lines among the plurality of data signal supply lines may be the same, and line widths of the non-overlapping data signal supply lines among the plurality of data signal supply lines may be different.

As shown in FIG. 18, FIG. 19, FIG. 20, or FIG. 21, in a plan view of the wiring region 23, the data signal supply line 13 (+) formed using the wiring W1 overlaps the data signal supply line 11 (+) formed using the wiring W2, but is arranged at a distance from and positioned parallel to the data signal supply line 12 (+) formed using the wiring W3, and is sandwiched between the data signal supply line 12 (+) formed using the wiring W3 and the data signal supply line 12 (−) formed using the wiring W3. In a plan view of the region from the wiring region 23 to the wiring region 24, the data signal supply line 13 (+) is spaced apart from the data signal supply line 11 (+), and is arranged so as to intersect the data signal supply line 12 (+) formed using the wiring W3 along the second direction D2. Furthermore, in the wiring region 25, the data signal supply line 13 (+) formed using the wiring W3 is arranged so as to be inclined with respect to the first direction D1, and is arranged at a distance from and positioned parallel to the data signal supply line 12 (+) formed using the wiring W2 and the data signal supply line 11 (+) formed using the wiring W1. The configuration of the data signal supply line 13 (+) according to the second embodiment other than that described here is the same as the configuration of the data signal supply line 13 (+) according to the first embodiment described in "1-5. Configuration of Routing Wiring Part 115". As described above, the connection of the data signal supply line 13 (+) according to the second embodiment is changed from the wiring W1 to the wiring W3.

As shown in FIG. 18, FIG. 20, or FIG. 21, in the data signal supply line 12 (+) according to the second embodiment, the wiring W3 is arranged so as to be inclined with respect to the first direction D1 in a plan view of the wiring region 23 and to be positioned substantially parallel along the direction D2 in the wiring region 24. The wiring W2 is arranged so as to be positioned substantially parallel along the second direction D2 in a plan view of the wiring region 24 and to be inclined with respect to the first direction D1 in a plan view of the wiring region 25. The opening WC2 is arranged on the wiring W2 along the third direction D3 in the wiring region 24 (see FIG. 27). That is, the wiring W3 is connected to the wiring W2 via the opening WC2. As described above, the connection of the data signal supply line 12 (+) according to the second embodiment is changed from the wiring W3 to the wiring W2.

As shown in FIG. 18, FIG. 19, or FIG. 20, in the data signal supply line 11 (+), the wiring W2 is arranged so as to be inclined with respect to the first direction D1 in a plan view of the wiring region 23 and to be positioned substantially parallel along the second direction D2 in a plan view of the wiring region 24. The wiring W19 is routed so as to be positioned substantially parallel along the second direction D2 in a plan view of the wiring region 24 and is arranged so as to be inclined with respect to the first direction D1 in a plan view of the wiring region 25. In addition, the opening WC1 is arranged on the wiring W1 along the third direction D3 in a plan view of the wiring region 24 (see FIG. 29). That is, the wiring W2 is connected to the wiring W1 via the opening WC1. As described above, the connection of the data signal supply line 11 (+) according to the second embodiment is changed from the wiring W2 to the wiring W1.

As shown in FIG. 22 and FIG. 24, in some plan views of the wiring region 27, the data signal supply line 13 (+) formed using the wiring W2 is inclined with respect to the first direction D1, and is arranged so as to overlap and to be positioned parallel to the data signal supply line 11 (+) formed using the wiring W1, and is arranged at a distance from and to be positioned parallel to the data signal supply line 12 (+) formed using the wiring W3. In addition, the data signal supply line 13 (+) formed using the wiring W2 is arranged so as to be positioned substantially parallel along the second direction D2 and to intersect the data signal supply line 11 (−) formed using the wiring W1, and is arranged so as to be positioned substantially parallel along the second direction D2 and to intersect the data signal supply line 12 (−) formed using the wiring W3. In a plan view of the wiring region 28 and the wiring region 29, the data signal supply line 13 (+) formed using the wiring W2 is arranged so as to be positioned substantially parallel along the second direction D2. As described above, the connection of the wiring of the wiring region 27, the wiring region 28 and the wiring region 29 of the data signal supply line 13 (+) is not changed.

As shown in FIG. 22, FIG. 24, or FIG. 25, in a plan view of the wiring region 27, the data signal supply line 12 (+) formed using the wiring W3 is inclined with respect to the first direction D1, and is arranged at a distance from, and to be positioned parallel to and not to overlap the data signal supply line 13 (+) formed using the wiring W2 and the data signal supply line 11 (+) formed using the wiring W1. Furthermore, in a plan view of the region from the wiring region 27 to the wiring region 28, the data signal supply line 12 (+) formed using the wiring W3 is arranged so as to intersect the data signal supply line 11 (+) formed using the wiring W1 and the data signal supply line 11 (−) formed using the wiring W1 along the second direction D2. The configuration of the data signal supply line 12 (+) according to the second embodiment other than that described here is the same as the configuration of the data signal supply line 12 (+) according to the first embodiment described in "1-5. Configuration of Routing Wiring Part 115". As described above, the connection of the wiring of the data signal supply line 12 (+) in the wiring region 27, the wiring region 28, and the wiring region 29 is changed from the wiring W3 to the wiring W2.

As shown in FIG. 22, FIG. 23, or FIG. 24, in some plan views of the wiring region 27, the data signal supply line 11 (+) formed using the wiring W1 is inclined with respect to the first direction D1, and is arranged so as to overlap and to be positioned parallel to the data signal supply line 13 (+) formed using the wiring W2, and is arranged at a distance from and to be positioned parallel to and not to overlap the data signal supply line 12 (+) formed using the wiring W3. Furthermore, in a plan view of the region from the wiring region 27 to the wiring region 28, the data signal supply line 11 (+) is arranged substantially parallel along the second direction D2 and is arranged to intersect the data signal supply line 12 (+) formed using the wiring W3. The configuration of the data signal supply line 11 (+) according to the second embodiment other than that described here is the same as the configuration of the data signal supply line 11 (+) according to the first embodiment described in "1-5. Configuration of Routing Wiring Part 115". As described above, the connection of the data signal supply line 11 (+) is changed from the wiring W1 to the wiring W2.

As shown in FIG. 22 and FIG. 24, in some plan views of the wiring region 27, the data signal supply line 13 (−) formed using the wiring W2 is inclined with respect to the first direction D1, and is arranged so as to overlap and to be positioned parallel to the data signal supply line 11 (−) formed using the wiring W1, and is arranged at a distance from and to be positioned parallel to and not to overlap the data signal supply line 12 (−) formed using the wiring W3. In a plan view of the wiring region 28 and the wiring region 29 other than part of the wiring region 27, the data signal supply line 13 (−) formed using the wiring W2 is arranged substantially parallel along the second direction D2 and does not overlap any data signal supply wiring.

As shown in FIG. 22, FIG. 24, or FIG. 25, in some plans view of the wiring region 27, the data signal supply line 12 (−) formed using the wiring W3 is inclined with respect to the first direction D1, and is arranged at a distance from and to be positioned parallel to and not to overlap the data signal supply line 13 (+) and the data signal supply line 13 (−) formed using the wiring W2, and the data signal supply line 11 (+) and the data signal supply line 11 (−) formed using the wiring W1. In addition, in some plan views of the wiring region 27, the data signal supply line 12 (−) formed using the wiring W3 is sandwiched between the data signal supply line 13 (+) formed using the wiring W2 and the data signal supply line 13 (−) formed using the wiring W2. Furthermore, in some plan views of the wiring region 27, the data signal supply line 12 (−) formed using the wiring W3 is arranged to be substantially parallel along the second direction D2 and to intersect the data signal supply line 11 (−) formed using the wiring W1.

2-2. Example of Cross-sectional Structure of Data Signal Supply Line 1

Next, a cross-sectional structure of the plurality of data signal supply lines 1 in the wiring region 23, the wiring region 24, and the wiring region 25 will be described as an example with reference to FIG. 26 to FIG. 29.

As shown in FIG. 26, the data signal supply line 13 (+) in the wiring region 23 is formed of the wiring W1 arranged on the substrate SUB. The data signal supply line 11 (+) in the wiring region 23 is formed of the wiring W2 arranged on the gate insulating layer Gl1. The data signal supply line 12 (+) in the wiring region 23 is formed of the wiring W3 arranged on the insulating layer IL2. For example, the data signal supply line 13 (+), the data signal supply line 12 (+), and the data signal supply line 11 (+) have the same width LW1. The data signal supply line 13 (+) overlaps the data signal supply line 11 (+) in the third direction D3. The data signal supply line 13 (+) and the data signal supply line 11 (+) do not overlap the data signal supply line 12 (+) in the third direction D3 and are arranged offset (separated) by at least the width LW1.

The data signal supply line 13 (−), the data signal supply line 12 (−), and the data signal supply line 11 (−) in the wiring region 23 have a similar configuration as the data signal supply line 13 (+), the data signal supply line 12 (+), and the data signal supply line 11 (+).

The interval between the data signal supply line 13 (−) and the data signal supply line 13 (+), the interval between the data signal supply line 12 (−) and the data signal supply line 12 (+), and the interval between the data signal supply line 11 (−) and the data signal supply line 11 (+) are the same.

As shown in FIG. 27, on the wiring region 23 side, the data signal supply line 13 (−) formed by using the wiring W1, the data signal supply line 11 (−) formed by using the wiring W2, and the data signal supply line 12 (−) formed by using the wiring W3 are stacked in this order from the substrate SUB side upward in the third direction. On the wiring region 23 side, the data signal supply line 13 (−) overlaps the data signal supply line 11 (−) in the third direction D3, and the data signal supply line 13 (−) and the data signal supply line 11 (−) do not overlap the data signal supply line 12 (−) in the third direction D3.

In addition, from the wiring region 23 toward the wiring region 25, the data signal supply line 13 (+) is configured using the wiring W1, the opening WC1 that opens the gate insulating layer Gl1 and the insulating layer IL1, the wiring 2, the opening WC2 that opens the insulating layer IL2, and the wiring W3, and the connection from the wiring W1 on the wiring region 23 side formed on the substrate SUB is changed to the wiring W3 on the wiring region 25 side formed above the wiring W1. The data signal supply line 13 (+) formed using the wiring W1 is arranged at a distance from the data signal supply line 13 (−) formed using the wiring W1 by at least the width of the data signal supply line 12 (−) formed using the wiring W3. The data signal supply line 11 (+) formed using the wiring W2 is arranged at a distance from the data signal supply line 11 (−) formed using the wiring W2 by at least the width of the data signal supply line 12 (−) formed using the wiring W3. The data signal supply line 12 (+) formed using the wiring W3 is arranged at a distance from the data signal supply line 12 (−) formed using the wiring W3 by at least the width of the data signal supply line 11 (+) formed using the wiring W2.

As shown in FIG. 28, on the wiring region 23 side, the data signal supply line 13 (−) formed by using the wiring W1 and the data signal supply line 11 (−) formed by using the wiring W2 are stacked in this order from the substrate SUB side upward in the third direction and overlap each other. The data signal supply line 12 (+) is formed using the wiring W2, the opening WC2 that opens the insulating layer IL2, and the wiring W3, and the connection from the wiring W3 on the wiring region 23 formed on the substrate SUB is changed to the wiring W2 on the wiring region 25 side formed closer to the substrate SUB than the wiring W3.

The data signal supply line 11 (+) formed using the wiring W2 is arranged at a distance from the data signal supply line 11 (−) formed using the wiring W2 by at least the width of the data signal supply line 12 (−) formed using the wiring W3. The data signal supply line 12 (+) formed using the wiring W3 is arranged at a distance from the data signal supply line 12 (−) formed using the wiring W3 by at least the width of the data signal supply line 11 (+) formed using the wiring W2. In addition, on the wiring region 25 side, the data signal supply line 13 (+) formed using the wiring W3 is arranged at a distance from the data signal supply line 12 (+) formed using the wiring W3.

Figure 29:
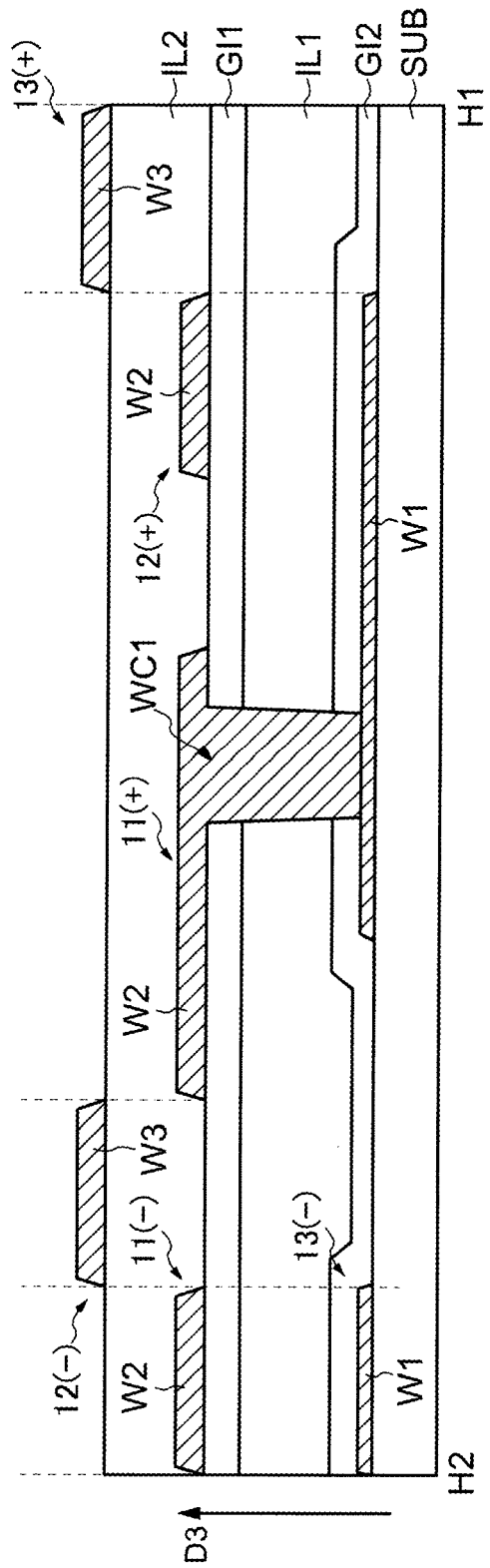
FIG. 29 is a cross-sectional view showing a cross-sectional structure along H1-H2 shown in FIG. 18.

As shown in FIG. 29, on the wiring region 23 side, a data signal supply line 13 (−) formed using the wiring W1 and the data signal supply line 11 (−) formed using the wiring W2 are stacked in this order from the substrate SUB side upward in the third direction and overlap each other. The data signal supply line 11 (+) is configured using the wiring W2, the opening WC1 that opens the gate insulating layer Gl1 and the insulating layer IL1, and the wiring W1, and the connection from the wiring W2 on the wiring region 23 side formed on the substrate SUB is changed to the wiring W1 on the wiring region 25 side formed closer to the substrate SUB than the wiring W2.

In addition, the data signal supply line 11 (+) formed using the wiring W2 is arranged at a distance from the data signal supply line 11 (−) formed using the wiring W2 by at least the width of the data signal supply line 12 (−) formed using the wiring W3, and is arranged at a distance from the data signal supply line 11 (+) formed using the wiring W2. Furthermore, on the wiring region 25 side, the connection of the data signal supply line 11 (+) is changed to the wiring W1, and the data signal supply line 11 (+) and the data signal supply line 12 (+) formed using the wiring W2 are stacked in this order from the substrate SUB side in the third direction upward and overlap each other.

In addition, the data signal supply line 13 (+) formed using the wiring W3 is arranged at a distance from the data signal supply line 12 (−) formed using the wiring W3. The connection of the data signal supply line 11 (+) is changed to the wiring W1, and the data signal supply line 11 (+) and the data signal supply line 12 (+) formed using the wiring W2 are arranged between the data signal supply line 13 (+) formed using the wiring W3 and the data signal supply line 12 (−) formed using the wiring W3.

The display device 10 according to the second embodiment has a similar configuration as the display device 10 according to the first embodiment. Specifically, the display device 10 according to the second embodiment includes the transistor Tr1 that overlaps the display region 122, is used in the pixel circuit 182, and includes the oxide semiconductor layer OS, the transistor Tr2 that overlaps the peripheral region 121, is used in the first driving circuit 110 and the second driving circuit 120, and includes the semiconductor layer S, and a transistor that is used in the IC chip 400 and formed using single-crystal silicon. For example, the material forming the semiconductor layer S is polysilicon, and the material forming the oxide semiconductor layer OS is a material other than polysilicon. In addition, the display device 10 according to the second embodiment includes the wiring W1 formed in the same layer as the gate electrode GL2 of the transistor Tr2, the wiring W2 formed in the same layer as the gate electrode GL1 of the transistor Tr1, and the wiring W3 formed in the same layer as the source electrode or drain electrode of the transistor Tr2 and the transistor Tr1. As a result, in the display device 10 according to the second embodiment, similar to the display device 10 according to the first embodiment, the transistor including the semiconductor layer S and the oxide semiconductor layer OS can be used in a suitable region, and the number of wirings to be stacked can be increased from the configuration using the transistor including either the semiconductor layer S or the oxide semiconductor layer OS.

The routing wiring part 115 of the display device 10 according to the second embodiment has a configuration in which, as the number of wirings to be stacked increases, in a plan view, two different wirings of the three different wirings are arranged at a distance (shifted) from the wiring of the remaining one layer by stacking the signal lines of the same polarity using the three layers of differing wirings (the wiring W1, the wiring W2, and the wiring W3).

As a result, the routing wiring part 115 of the display device 10 according to the second embodiment has a higher degree of freedom in routing wiring while reducing the step caused by the overlap of the plurality of wirings and the signal line can be efficiently arranged. In addition, the routing wiring part 115 of the display device 10 according to the second embodiment can be arranged so that the connection can be changed using the three layers of different wirings and two different openings (the opening WC1 and the opening WC2) in a state in which the steps caused by the overlap of the plurality of wirings are released, and the difference in resistance between the wirings can be suppressed, and the area can be reduced.

Various configurations exemplified as an embodiment of the present invention can be appropriately combined and implemented as long as no contradiction is caused. In addition, various configurations exemplified as an embodiment of the present invention can be appropriately replaced as long as no contradiction is caused. The addition, deletion, or design change of components, or the addition, deletion, or condition change of processes as appropriate by those skilled in the art based on the display device disclosed in the present specification and the drawings are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
   a first transistor including a first material as a semiconductor material and including a first gate electrode;
   a second transistor including a second material as a semiconductor material different from the first material and including a second gate electrode arranged in a different layer from the first gate electrode;
   a first wiring arranged in the same layer as the first gate electrode;
   a second wiring arranged in the same layer as the second gate electrode;
   a third wiring formed in the same layer as a source electrode or drain electrode of the second transistor and different from the first wiring and the second wiring;
   wherein the first wiring, the second wiring and the third wiring overlap in a plan view;
   a plurality of pixels arranged in a matrix in a first direction and a second direction intersecting the first direction; a first driving circuit electrically connected to the plurality of pixels; an IC chip; and
   a plurality of data signal supply lines arranged between the first driving circuit and the IC chip and connecting the first driving circuit and the IC chip,
   wherein
   the first material is polysilicon, the second material is an oxide semiconductor, each of the plurality of pixels includes the second transistor, and the first driving circuit includes the first transistor,
   the plurality of data signal supply lines includes a first signal line having a positive polarity, a second signal line having a positive polarity, and a third signal line having a positive polarity,
   the first signal line includes a second wiring and the third wiring, the second signal line includes a first wiring and the second wiring,
   the third signal line includes the first wiring, a second wiring, and a third wiring, and
   the third wiring of the third signal line overlaps the first wiring of the second signal line and the second wiring of the first signal line in a plan view.

2. The display device according to claim 1, wherein
   the plurality of data signal supply lines includes a fourth signal line having a negative polarity, a fifth signal line having a negative polarity, and a sixth signal line having a negative polarity,
   the fourth signal line includes a second wiring and a third wiring,
   the fifth signal line includes a first wiring and a second wiring,
   the sixth signal line includes a first wiring, a second wiring, and a third wiring,
   the first wiring of the sixth signal line overlaps the second wiring of the fifth signal line and the third wiring of the fourth signal line in a plan view, and
   the third wiring of the sixth signal line overlaps the first wiring of the fifth signal line and the second wiring of the fourth signal line in a plan view.

3. The display device according to claim 2, wherein
   a line width of the first wiring of the third signal line is the same as a line width of the second wiring of the second signal line and a line width of the third wiring of the first signal line,
   a line width of the third wiring of the third signal line is the same as a line width of the first wiring of the second signal line and a line width of the second wiring of the first signal line,
   a line width of the first wiring of the sixth signal line is the same as a line width of the second wiring of the fifth signal line and a line width of the third wiring of the fourth signal line, and
   a line width of the third wiring of the sixth signal line is the same as a line width of the first wiring of the fifth signal line and a line width of the second wiring of the fourth signal line.

4. The display device according to claim 2, wherein
   the first wiring of the third signal line, the second wiring of the second signal line, the third wiring of the first signal line, the first wiring of the sixth signal line, the second wiring of the fifth signal line, and the third wiring of the fourth signal line are inclined with respect to the second direction in a plan view and are arranged parallel to each other along the inclination.

5. The display device according to claim 2, wherein the first signal line, the fourth signal line, the second signal line, the fifth signal line, the third signal line, and the sixth signal line are arranged in this order along the second direction in a plan view and are electrically connected to the first driving circuit.

6. The display device according to claim 2, wherein, in a plan view, the third wiring of the third signal line is arranged at a distance from the third wiring of the first signal line, the second wiring of the third signal line is arranged at a distance from the second wiring of the second signal line, and the first wiring of the third signal line connected to the second wiring of the third signal line overlaps the second wiring of the second signal line and the third wiring of the first signal line.

7. The display device according to claim 2, wherein, in a plan view, the third wiring of the third signal line is arranged at a distance from the third wiring of the first signal line, the second wiring of the second signal line overlaps the third wiring of the third signal line, and the first wiring of the second signal line connected to the second wiring of the second signal line overlaps the third wiring of the first signal line.

8. The display device according to claim 2, wherein, in a plan view, the third wiring of the first signal line is arranged at a distance from the third wiring of the third signal line, and the second wiring of the first signal line connected to the third wiring of the first signal line overlaps the third wiring of the third signal line and the first wiring of the second signal line.

* * * * *